US009711946B2

(12) United States Patent
Kaneko et al.

(10) Patent No.: US 9,711,946 B2
(45) Date of Patent: Jul. 18, 2017

(54) VERTICAL CAVITY SURFACE EMITTING LASER AND ATOMIC OSCILLATOR

(71) Applicant: Seiko Epson Corporation, Tokyo (JP)

(72) Inventors: Tsuyoshi Kaneko, Shimosuwa (JP); Tetsuo Nishida, Suwa (JP); Yuji Kurachi, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/576,837

(22) Filed: Dec. 19, 2014

(65) Prior Publication Data
US 2015/0180207 A1 Jun. 25, 2015

(30) Foreign Application Priority Data

Dec. 20, 2013 (JP) ................................ 2013-263459

(51) Int. Cl.
*H01S 3/08* (2006.01)
*H01S 5/183* (2006.01)
(Continued)

(52) U.S. Cl.
CPC ............ *H01S 5/183* (2013.01); *H01S 5/1835* (2013.01); *H01S 5/18355* (2013.01); *G04F 5/145* (2013.01); *H01S 5/0425* (2013.01); *H01S 5/18311* (2013.01); *H01S 5/18347* (2013.01); *H01S 5/18352* (2013.01); *H01S 5/18372* (2013.01); *H01S 5/3201* (2013.01); *H01S 2301/176* (2013.01)

(58) Field of Classification Search
CPC .... H01S 5/423; H01S 5/0217; H01S 5/02288; H01S 5/0425; H01S 5/183; H01S 5/18341; H01S 5/18391; H01S 5/02284

USPC .......................................................... 372/92
See application file for complete search history.

(56) References Cited

U.S. PATENT DOCUMENTS 4,309,605 A * 1/1982 Okabe ...................... G01V 8/12
250/239
6,134,251 A 10/2000 Kawase et al.
(Continued)

FOREIGN PATENT DOCUMENTS

EP 1104056 A1 5/2001
JP 2001-189525 A 7/2001
JP 3482824 B2 1/2004

OTHER PUBLICATIONS

Extended European Search Report for Application No. EP 14 19 9276 dated Aug. 6, 2015 (9 pages).

*Primary Examiner* — Jessica Manno
*Assistant Examiner* — Vu A Vu
(74) *Attorney, Agent, or Firm* — Harness, Dickey & Pierce, P.L.C.

(57) ABSTRACT

A vertical cavity surface emitting laser includes: a substrate; a laminated body which is provided over the substrate; and a resin layer which is provided on at least a side surface of the laminated body, wherein the laminated body at least includes a first mirror layer provided over the substrate, an active layer provided over the first mirror layer, and a second mirror layer provided over the active layer, in a plan view, a length of the laminated body in a first direction is greater than a length of the laminated body in a second direction orthogonal to the first direction, and in the plan view, a length of the resin layer in the first direction is greater than a length of the resin layer in the second direction.

31 Claims, 19 Drawing Sheets

(51) Int. Cl.
G04F 5/14 (2006.01)
H01S 5/042 (2006.01)
H01S 5/32 (2006.01)

(56) References Cited

U.S. PATENT DOCUMENTS

| | | | |
|---|---|---|---|
| 6,631,152 B2* | 10/2003 | Kaneko | H01S 5/1835 372/46.01 |
| 6,751,242 B2 | 6/2004 | Kaneko et al. | |
| 6,924,511 B2* | 8/2005 | Wang | B82Y 20/00 257/103 |
| 7,333,522 B2 | 2/2008 | Ostermann et al. | |
| 7,339,971 B2* | 3/2008 | Mochizuki et al. | 372/50.21 |
| 7,450,625 B2* | 11/2008 | Kaneko | B82Y 20/00 372/38.05 |
| 7,526,008 B2* | 4/2009 | Shiozaki | H01S 5/18355 372/43.01 |
| 7,652,244 B2* | 1/2010 | Aizpuru | G01D 5/342 250/214.1 |
| 7,852,896 B2* | 12/2010 | Onishi et al. | 372/50.11 |
| 2001/0026567 A1 | 10/2001 | Kaneko et al. | |
| 2002/0044581 A1 | 4/2002 | Kaneko et al. | |
| 2004/0114653 A1* | 6/2004 | Omori | H01S 5/18311 372/46.01 |
| 2010/0328747 A1* | 12/2010 | Jikutani et al. | 359/205.1 |
| 2011/0128082 A1* | 6/2011 | Maki et al. | 331/94.1 |
| 2013/0265113 A1 | 10/2013 | Nishida | |
| 2014/0354367 A1* | 12/2014 | Suzuki | B82Y 20/00 331/94.1 |

\* cited by examiner

VERTICAL CAVITY SURFACE EMITTING LASER AND ATOMIC OSCILLATOR

BACKGROUND

1. Technical Field

The present invention relates to a vertical cavity surface emitting laser and an atomic oscillator.

2. Related Art

A vertical cavity surface emitting laser (VCSEL) is, for example, used as a light source of an atomic oscillator using coherent population trapping (CPT) which is a type of quantum interference effect.

In the vertical cavity surface emitting laser, a resonator generally has an isotropic structure, and accordingly it is difficult to control a polarization direction of the laser light emitted from the resonator. JP-A-2001-189525, for example, discloses a vertical cavity surface emitting laser which applies an anisotropic stress to a resonator (active layer) by an insulation layer which is formed to come in contact with an outer surface of a columnar semiconductor deposition body including apart of the resonator, and controls a polarization direction of laser light to a specific direction.

However, in the vertical cavity surface emitting laser disclosed in JP-A-2001-189525, it is difficult to apply sufficient stress to the resonator by the insulation layer, and the polarization direction of the laser light may not be stabilized.

SUMMARY

An advantage of some aspects of the invention is to provide a vertical cavity surface emitting laser which can stabilize a polarization direction of laser light. In addition, another advantage of some aspects of the invention is to provide an atomic oscillator including the vertical cavity surface emitting laser.

An aspect of the invention is directed to a vertical cavity surface emitting laser including: a substrate; a laminated body which is provided over the substrate; and a resin layer which is provided on at least a side surface of the laminated body, in which the laminated body at least includes a first mirror layer provided over the substrate, an active layer provided over the first mirror layer, and a second mirror layer provided over the active layer, in a plan view, a length of the laminated body in a first direction is greater than a length of the laminated body in a second direction orthogonal to the first direction, and in the plan view, a length of the resin layer in the first direction is greater than a length of the resin layer in the second direction.

According to the vertical cavity surface emitting laser, since the length of the laminated body in the first direction is greater than the length of the laminated body in the second direction in a plan view, it is possible to apply anisotropic stress to the active layer. Accordingly, in the vertical cavity surface emitting laser, stress generated by the shape of the laminated body and stress generated by the resin layer can be applied to the active layer, and it is possible to stabilize a polarization direction of laser light. Therefore, it is possible to further stabilize the polarization direction of the laser light, compared to a case where the stress is applied to the active layer only by the resin layer.

In the description herein, for example, when a phrase "over" is used in a sentence such as "to form a specific element (hereinafter, referred to as a "B") over another specific element (hereinafter, referred to as an "A")", the phrase "over" includes a case of forming the B directly on the A and a case of forming the B on the A with another element interposed therebetween.

In the vertical cavity surface emitting laser according to the aspect of the invention, in the plan view, the laminated body may include a first portion, a second portion, and a third portion provided between the first portion and the second portion, the first portion and the second portion may face each other in the first direction, and in the plan view, a length of the third portion in the second direction may be greater than a length of the first portion or a length of the second portion in the second direction.

According to the vertical cavity surface emitting laser with this configuration, since the laminated body includes the first portion and the second portion, it is possible to apply the stress to the third portion. Accordingly, in the vertical cavity surface emitting laser, stress generated by the first portion and the second portion and stress generated by the resin layer can be applied to the active layer, and it is possible to stabilize the polarization direction of the laser light.

In the vertical cavity surface emitting laser according to the aspect of the invention, in the plan view, an outer rim of the resin layer may include a first straight line, a second straight line facing the first straight line, a first curve which connects the first straight line and the second straight line to each other, and a second curve which faces the first curve and connects the first straight line and the second straight line to each other.

According to the vertical cavity surface emitting laser with this configuration, the stress is not concentrated on a portion where the first straight line, the second straight line, and the first curve are connected to each other, compared to a case where the first curve has a straight line shape. Therefore, cracks rarely occur in the portion described above. In addition, cracks rarely occur in a portion where the first straight line, the second straight line, and the second curve are connected to each other, for the same reason.

In the vertical cavity surface emitting laser according to the aspect of the invention, in the plan view, the first portion and the first curve may be positioned on the same side when seen from the third portion, and in the plan view, when an end of the first straight line coming in contact with the first curve is set as a first end, an end of the second straight line coming in contact with the first curve is set as a second end, and a first virtual straight line passing through the first end and the second end is drawn, an end portion of the first portion may be positioned on the third portion side, when seen from the first virtual straight line.

According to the vertical cavity surface emitting laser with this configuration, even if cracks occur in the portion where the first straight line, the second straight line, and the first curve are connected to each other, since the end portion of the first portion is positioned on the third portion side which is the inner side with respect to the portion described above, it is possible to suppress the cracks from reaching the first portion. Therefore, it is possible to increase protection performance with respect to the laminated body.

In the vertical cavity surface emitting laser according to the aspect of the invention, the laminated body may further include a current constriction layer provided between the first mirror layer and the second mirror layer, a first area including a plurality of oxide layers provided to be connected to the first mirror layer, and a second area including a plurality of oxide layers provided to be connected to the second mirror layer, in the plan view, an oxide area may be configured with the first area and the second area of the first portion of the laminated body, and in the plan view, when a width of the oxide area is set as W1 and a width of an upper surface of the second mirror layer of the first portion is set as W2, the relationship of W2/W1≤3.3 may be satisfied.

According to the vertical cavity surface emitting laser with this configuration, it is possible to generate a large amount of distortion in the active layer by the oxide area, and it is possible to stabilize the polarization direction of the laser light (this will be described later in detail).

In the vertical cavity surface emitting laser according to the aspect of the invention, the relationship of W2/W1≤2.2 may be satisfied.

According to the vertical cavity surface emitting laser with this configuration, it is possible to further stabilize the polarization direction of the laser light.

In the vertical cavity surface emitting laser according to the aspect of the invention, the relationship of 1.3≤W2/W1 may be satisfied.

According to the vertical cavity surface emitting laser with this configuration, it is possible to even further stabilize the polarization direction of the laser light.

In the vertical cavity surface emitting laser according to the aspect of the invention, in the plan view, when a second virtual straight line orthogonal to the first direction is drawn on the first portion, the W2 which is the width of the upper surface of the second mirror layer may be positioned on the second virtual straight line.

According to the vertical cavity surface emitting laser with this configuration, it is possible to stabilize the polarization direction of the laser light.

In the vertical cavity surface emitting laser according to the aspect of the invention, in the plan view, a first portion and a second portion of the oxide area may be provided in a position overlapped with the second virtual straight line so as to interpose the upper surface of the second mirror layer therebetween, W1 which is the width of the oxide area may be a width of the first portion of the oxide area, and W1 which is the width of the oxide area may be positioned on the second virtual straight line.

According to the vertical cavity surface emitting laser with this configuration, it is possible to stabilize the polarization direction of the laser light.

In the vertical cavity surface emitting laser according to the aspect of the invention, the laminated body may further include a current constriction layer provided between the first mirror layer and the second mirror layer, a first area including a plurality of oxide layers provided to be connected to the first mirror layer, and a second area including a plurality of oxide layers provided to be connected to the second mirror layer, in a cross-sectional view, the lowest oxide layer among the plurality of oxide layers in the first area may include a first end facing an end which comes in contact with the first mirror layer of the first portion, in the cross-sectional view, the highest oxide layer among the plurality of oxide layers in the second area may include a second end which comes in contact with the second mirror layer of the first portion, and in the plan view, when a width from the first end to the second end is set as W1 and a width of an upper surface of the second mirror layer of the first portion is set as W2, the relationship of W2/W1≤3.3 may be satisfied.

According to the vertical cavity surface emitting laser with this configuration, it is possible to generate a large amount of distortion in the active layer by the oxide layer, and it is possible to stabilize the polarization direction of the laser light.

In the vertical cavity surface emitting laser according to the aspect of the invention, the relationship of W2/W1≤2.2 may be satisfied.

According to the vertical cavity surface emitting laser with this configuration, it is possible to even further stabilize the polarization direction of the laser light.

In the vertical cavity surface emitting laser according to the aspect of the invention, the relationship of 1.3≤W2/W1 may be satisfied.

According to the vertical cavity surface emitting laser with this configuration, it is possible to even further stabilize the polarization direction of the laser light.

In the vertical cavity surface emitting laser according to the aspect of the invention, in the plan view, when a second virtual straight line orthogonal to the first direction is drawn on the first portion, the W2 which is the width of the upper surface of the second mirror layer may be positioned on the second virtual straight line.

According to the vertical cavity surface emitting laser with this configuration, it is possible to stabilize the polarization direction of the laser light.

In the vertical cavity surface emitting laser according to the aspect of the invention, in the cross-sectional view, a first portion and a second portion of the first area may be provided so as to interpose the first mirror layer of the first portion of the laminated body, in the cross-sectional view, a first portion of the second area may be provided over the first portion of the first area and a second portion of the second area may be provided over the second portion of the first area, so as to interpose the second mirror layer of the first portion of the laminated body, the first portion of the first area may include the lowest oxide layer, the first portion of the second area may include the highest oxide layer, and W1 which is a width from the first end of the lowest oxide layer to the second end of the highest oxide layer may be positioned on the second virtual straight line.

According to the vertical cavity surface emitting laser with this configuration, it is possible to stabilize the polarization direction of the laser light.

In the vertical cavity surface emitting laser according to the aspect of the invention, in the plan view, the resin layer may have a shape line-symmetrical with respect to a third virtual straight line in the second direction passing through a center of the third portion.

According to the vertical cavity surface emitting laser with this configuration, it is possible to stabilize the polarization direction of the laser light.

In the vertical cavity surface emitting laser according to the aspect of the invention, in the plan view, the resin layer may not have a shape line-symmetrical with respect to a third virtual straight line in the second direction passing through a center of the third portion.

According to the vertical cavity surface emitting laser with this configuration, it is possible to stabilize the polarization direction of the laser light.

In the vertical cavity surface emitting laser according to the aspect of the invention, in the plan view, the laminated body may further include a first distortion imparting portion, a second distortion imparting portion, and a resonance portion which is provided between the first distortion imparting portion and the second distortion imparting portion and resonates light generated by the active layer, the first distortion imparting portion and the second distortion imparting portion may face each other in the first direction, and in the plan view, a length of the resonance portion in the second direction may be greater than a length of the first distortion imparting portion or a length of the second distortion imparting portion in the second direction.

According to the vertical cavity surface emitting laser with this configuration, since the laminated body includes the first distortion imparting portion and the second distortion imparting portion, it is possible to apply the stress to the resonance portion. Accordingly, in the vertical cavity surface emitting laser, stress generated by the first distortion imparting portion and the second distortion imparting portion and stress generated by the resin layer can be applied to the active layer, and it is possible to stabilize the polarization direction of the laser light.

In the vertical cavity surface emitting laser according to the aspect of the invention, in the plan view, an outer rim of the resin layer may include a first straight line, a second straight line facing the first straight line, a first curve which connects the first straight line and the second straight line to each other, and a second curve which faces the first curve and connects the first straight line and the second straight line to each other.

According to the vertical cavity surface emitting laser with this configuration, the stress is not concentrated on a portion where the first straight line, the second straight line, and the first curve are connected to each other, compared to a case where the first curve has a straight line shape. Therefore, cracks rarely occur in the portion described above. In addition, cracks rarely occur in a portion where the first straight line, the second straight line, and the second curve are connected to each other, for the same reason.

In the vertical cavity surface emitting laser according to the aspect of the invention, in the plan view, the first distortion imparting portion and the first curve may be positioned on the same side when seen from the resonance portion, and in the plan view, when an end of the first straight line coming in contact with the first curve is set as a first end, an end of the second straight line coming in contact with the first curve is set as a second end, and a first virtual straight line passing through the first end and the second end is drawn, an end portion of the first distortion imparting portion may be positioned on the resonance portion side, when seen from the first virtual straight line.

According to the vertical cavity surface emitting laser with this configuration, even if cracks occur in the portion where the first straight line, the second straight line, and the first curve are connected to each other, since the end portion of the first distortion imparting portion is positioned on the third portion side which is the inner side with respect to the portion described above, it is possible to suppress the cracks from reaching the first distortion imparting portion. Therefore, it is possible to increase protection performance with respect to the laminated body.

In the vertical cavity surface emitting laser according to the aspect of the invention, the laminated body may further include a current constriction layer provided between the first mirror layer and the second mirror layer, a first area including a plurality of oxide layers provided to be connected to the first mirror layer, and a second area including a plurality of oxide layers provided to be connected to the second mirror layer, in the plan view, an oxide area may be configured with the first area and the second area of the first distortion imparting portion of the laminated body, and in the plan view, when a width of the oxide area is set as W1 and a width of an upper surface of the second mirror layer of the first distortion imparting portion is set as W2, the relationship of $W2/W1 \leq 3.3$ may be satisfied.

According to the vertical cavity surface emitting laser with this configuration, it is possible to generate a large amount of distortion in the active layer by the oxide area, and it is possible to stabilize the polarization direction of the laser light (this will be described later in detail).

In the vertical cavity surface emitting laser according to the aspect of the invention, the relationship of $W2/W1 \leq 2.2$ may be satisfied.

According to the vertical cavity surface emitting laser with this configuration, it is possible to even further stabilize the polarization direction of the laser light.

In the vertical cavity surface emitting laser according to the aspect of the invention, the relationship of $1.3 \leq W2/W1$ may be satisfied.

According to the vertical cavity surface emitting laser with this configuration, it is possible to even further stabilize the polarization direction of the laser light.

In the vertical cavity surface emitting laser according to the aspect of the invention, in the plan view, when a second virtual straight line orthogonal to the first direction is drawn on the first distortion imparting portion, the W2 which is the width of the upper surface of the second mirror layer may be positioned on the second virtual straight line.

According to the vertical cavity surface emitting laser with this configuration, it is possible to stabilize the polarization direction of the laser light.

In the vertical cavity surface emitting laser according to the aspect of the invention, in the plan view, a first portion and a second portion of the oxide area may be provided in a position overlapped with the second virtual straight line so as to interpose the upper surface of the second mirror layer therebetween, the W1 which is the width of the oxide area may be a width of the first portion of the oxide area, and the W1 which is the width of the oxide area may be positioned on the second virtual straight line.

According to the vertical cavity surface emitting laser with this configuration, it is possible to stabilize the polarization direction of the laser light.

In the vertical cavity surface emitting laser according to the aspect of the invention, the laminated body may further include a current constriction layer provided between the first mirror layer and the second mirror layer, a first area including a plurality of oxide layers provided to be connected to the first mirror layer, and a second area including a plurality of oxide layers provided to be connected to the second mirror layer, in a cross-sectional view, the lowest oxide layer among the plurality of oxide layers in the first area may include a first end facing an end which comes in contact with the first mirror layer of the first distortion imparting portion, in the cross-sectional view, the highest oxide layer among the plurality of oxide layers in the second area may include a second end which comes in contact with the second mirror layer of the first distortion imparting portion, and in the plan view, when a width from the first end to the second end is set as W1 and a width of an upper surface of the second mirror layer of the first distortion imparting portion is set as W2, the relationship of $W2/W1 \leq 3.3$ may be satisfied.

According to the vertical cavity surface emitting laser with this configuration, it is possible to generate a large amount of distortion in the active layer by the oxide area, and it is possible to stabilize the polarization direction of the laser light (this will be described later in detail).

In the vertical cavity surface emitting laser according to the aspect of the invention, the relationship of $W2/W1 \leq 2.2$ may be satisfied.

According to the vertical cavity surface emitting laser with this configuration, it is possible to even further stabilize the polarization direction of the laser light.

In the vertical cavity surface emitting laser according to the aspect of the invention, the relationship of $1.3 \leq W2/W1$ may be satisfied.

According to the vertical cavity surface emitting laser with this configuration, it is possible to even further stabilize the polarization direction of the laser light.

In the vertical cavity surface emitting laser according to the aspect of the invention, in the plan view, when a second virtual straight line orthogonal to the first direction is drawn on the first distortion imparting portion, the W2 which is the width of the upper surface of the second mirror layer may be positioned on the second virtual straight line.

According to the vertical cavity surface emitting laser with this configuration, it is possible to stabilize the polarization direction of the laser light.

In the vertical cavity surface emitting laser according to the aspect of the invention, in the cross-sectional view, a first portion and a second portion of the first area may be provided so as to interpose the first mirror layer of the first distortion imparting portion of the laminated body, in the cross-sectional view, a first portion of the second area may be provided over the first portion of the first area and a second portion of the second area may be provided over the second portion of the first area, so as to interpose the second mirror layer of the first distortion imparting portion of the laminated body, the first portion of the first area may include the lowest oxide layer, the first portion of the second area may include the highest oxide layer, and W1 which is a width from the first end of the lowest oxide layer to the second end of the highest oxide layer may be positioned on the second virtual straight line.

According to the vertical cavity surface emitting laser with this configuration, it is possible to stabilize the polarization direction of the laser light.

In the vertical cavity surface emitting laser according to the aspect of the invention, in the plan view, the resin layer may have a shape line-symmetrical with respect to a third virtual straight line in the second direction passing through a center of the resonance portion.

According to the vertical cavity surface emitting laser with this configuration, it is possible to stabilize the polarization direction of the laser light.

In the vertical cavity surface emitting laser according to the aspect of the invention, in the plan view, the resin layer may not have a shape line-symmetrical with respect to a third virtual straight line in the second direction passing through a center of the resonance portion.

According to the vertical cavity surface emitting laser with this configuration, it is possible to stabilize the polarization direction of the laser light.

In the vertical cavity surface emitting laser according to the aspect of the invention, a material of the resin layer may be polyimide.

According to the vertical cavity surface emitting laser with this configuration, the resin layer can apply great stress with respect to the resonance portion (third portion). Therefore, it is possible to stabilize the polarization direction of the laser light.

Another aspect of the invention is directed to an atomic oscillator including: the vertical cavity surface emitting laser according to the aspect of the invention.

According to the atomic oscillator, since the atomic oscillator includes the vertical cavity surface emitting laser according to the aspect of the invention, it is possible to stably emit circularly polarized light to the gas cell through a λ/4 plate, for example, and it is possible to increase frequency stability of the atomic oscillator.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Hereinafter, preferred embodiments of the invention will be described in detail with reference to the drawings. The embodiments described below are not intended to unduly limit the scope of the invention disclosed in the aspects. The configurations described below are not necessarily essential constituent elements of the invention.

1. First Embodiment

1.1. Vertical Cavity Surface Emitting Laser

Figure 1:
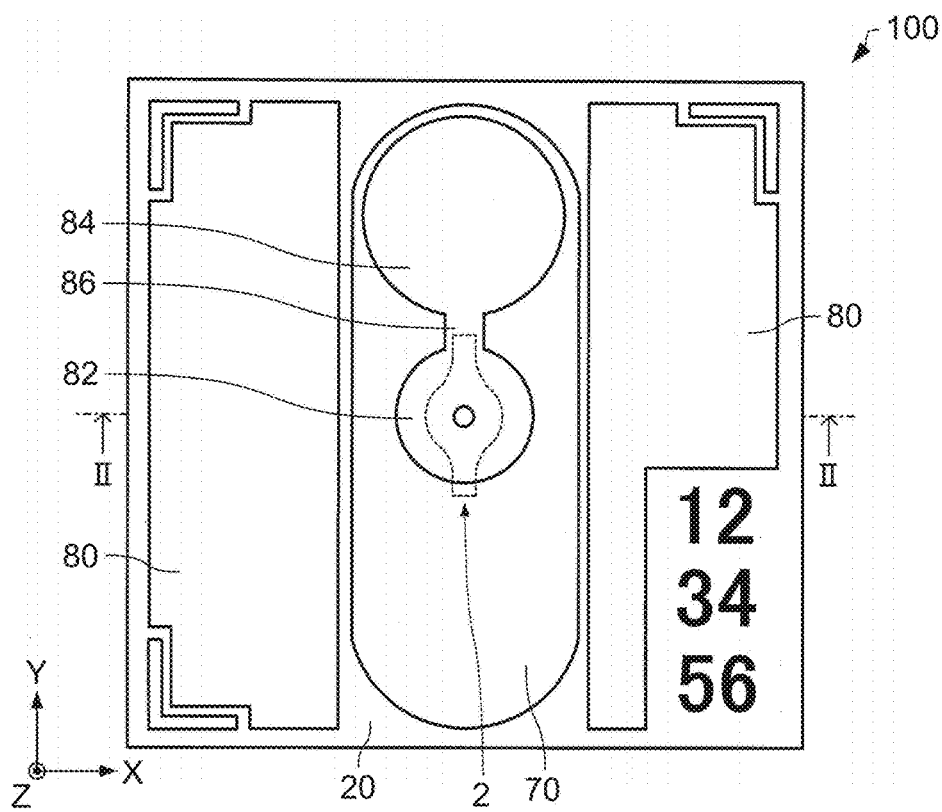
FIG. 1 is a plan view schematically showing a vertical cavity surface emitting laser according to a first embodiment.
Figure 2:
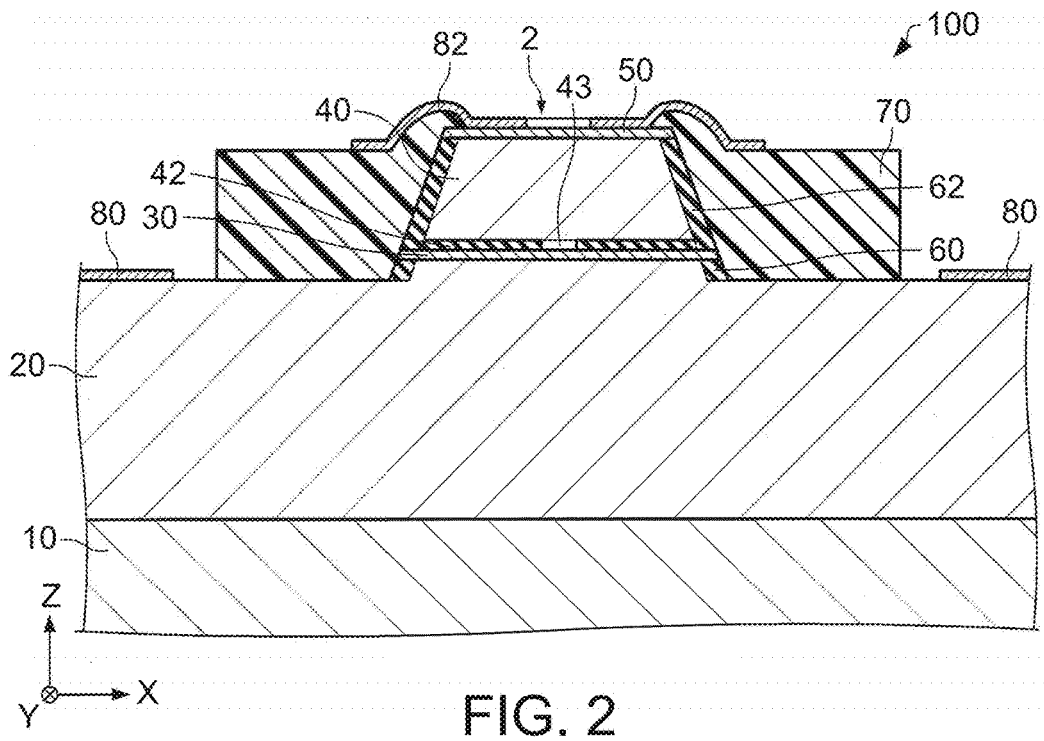
FIG. 2 is a cross-sectional view schematically showing a vertical cavity surface emitting laser according to a first embodiment.
Figure 3:
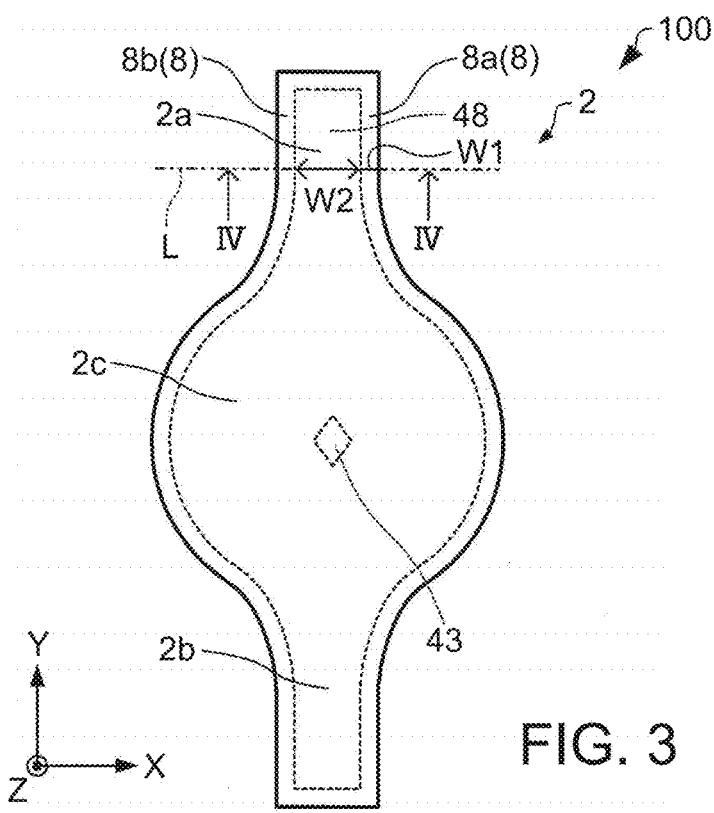
FIG. 3 is a plan view schematically showing a vertical cavity surface emitting laser according to a first embodiment.
Figure 4:
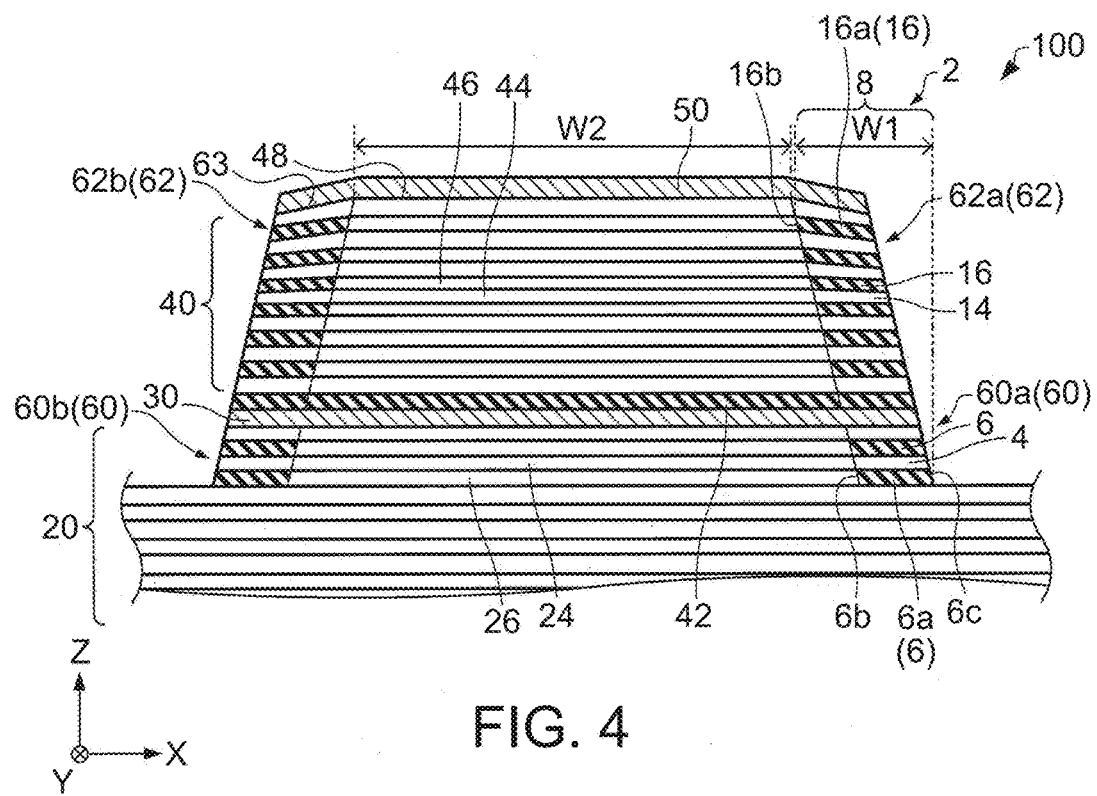
FIG. 4 is a cross-sectional view schematically showing a vertical cavity surface emitting laser according to a first embodiment.

First, a vertical cavity surface emitting laser according to a first embodiment will be described with reference to the drawings. FIG. 1 is a plan view schematically showing a vertical cavity surface emitting laser 100 according to the first embodiment. FIG. 2 is a cross-sectional view which is taken along line II-II of FIG. 1 and schematically shows the vertical cavity surface emitting laser 100 according to the first embodiment. FIG. 3 is a plan view schematically showing the vertical cavity surface emitting laser 100 according to the first embodiment. FIG. 4 is a cross-sectional view which is taken along line IV-IV of FIG. 3 and schematically shows the vertical cavity surface emitting laser 100 according to the first embodiment.

For the sake of convenience, FIG. 2 shows a simplified laminated body 2. In FIG. 2, members other than the laminated body 2 of the vertical cavity surface emitting laser 100 are omitted. FIGS. 1 to 4 show an X axis, a Y axis, and a Z axis as three axes orthogonal to each other.

As shown in FIGS. 1 to 4, the vertical cavity surface emitting laser 100 includes a substrate 10, a first mirror layer 20, an active layer 30, a second mirror layer 40, a current constriction layer 42, a contact layer 50, first areas 60 (first sidewalls), second areas 62 (second sidewalls), a resin layer 70, first electrodes 80, and second electrodes 82.

The substrate 10 is, for example, a first conductive (for example, n-type) GaAs substrate.

The first mirror layer 20 is formed on the substrate 10. The first mirror layer 20 is a first conductive semiconductor layer. As shown in FIG. 4, the first mirror layer 20 is a distribution Bragg reflection (DBR) type mirror in which high refractive index layers 24 and low refractive index layers 26 are laminated onto each other. The high refractive index layer 24 is, for example, an n-type $Al_{0.12}Ga_{0.88}As$ layer on which silicon is doped. The low refractive index layer 26 is, for example, an n-type $Al_{0.9}Ga_{0.1}As$ layer on which silicon is doped. The number (number of pairs) of laminated high refractive index layers 24 and low refractive index layers 26 is, for example, 10 pairs to 50 pairs, specifically, 40.5 pairs.

The active layer 30 is provided on the first mirror layer 20. The active layer 30, for example, has a multiple quantum well (MQW) structure in which three layers having a quantum well structure configured with an i-type $In_{0.06}Ga_{0.94}As$ layer and an i-type $Al_{0.3}Ga_{0.7}As$ layer are overlapped.

The second mirror layer 40 is formed on the active layer 30. The second mirror layer 40 is a second conductive (for example, p-type) semiconductor layer. The second mirror layer 40 is a distribution Bragg reflection (DBR) type mirror in which high refractive index layers 44 and low refractive index layers 46 are laminated onto each other. The high refractive index layer 44 is, for example, a p-type $Al_{0.12}Ga_{0.88}As$ layer on which carbon is doped. The low refractive index layer 46 is, for example, a p-type $Al_{0.9}Ga_{0.1}As$ layer on which carbon is doped. The number (number of pairs) of laminated high refractive index layers 44 and low refractive index layers 46 is, for example, 3 pairs to 40 pairs, specifically, 20 pairs.

The second mirror layer 40, the active layer 30, and the first mirror layer 20 configure a vertical resonator-type pin diode. When a forward voltage of the pin diode is applied between the electrodes 80 and 82, recombination between electrons and positive holes occurs in the active layer 30, and the light emitting occurs. The light generated in the active layer 30 reciprocates between the first mirror layer 20 and the second mirror layer 40 (multiple reflection), the induced emission occurs at that time, and the intensity is amplified. When an optical gain exceeds an optical loss, laser oscillation occurs, and the laser light is emitted in a vertical direction (a lamination direction of the first mirror layer 20 and the active layer 30) from the upper surface of the contact layer 50.

The current constriction layer 42 is provided between the first mirror layer 20 and the second mirror layer 40. In the example shown in the drawing, the current constriction layer 42 is provided on the active layer 30. The current constriction layer 42 can also be provided in the first mirror layer 20 or the second mirror layer 40. In this case as well, the current constriction layer 42 is assumed to be provided between the first mirror layer 20 and the second mirror layer 40. The current constriction layer 42 is an insulation layer in which an opening 43 is formed. The current constriction layer 42 can prevent spreading of the current injected to a vertical resonator by the electrodes 80 and 82 in a planar direction (direction orthogonal to the lamination direction of the first mirror layer 20 and the active layer 30).

The contact layer 50 is provided on the second mirror layer 40. The contact layer 50 is a second conductive semiconductor layer. Specifically, the contact layer 50 is a p-type GaAs layer on which carbon is doped.

As shown in FIG. 4, the first areas 60 are provided on lateral portions of the first mirror layer 20 configuring the laminated body 2. The first areas 60 include a plurality of oxide layers 6 which are provided to be connected to the first mirror layer 20 (in the example shown in the drawing, apart of the first mirror layer 20). Specifically, first areas 60 are configured with the oxide layers 6 obtained by oxidizing layers connected to the low refractive index layers 26 (for example, $Al_{0.9}Ga_{0.1}As$ layers) configuring the first mirror layer 20, and layers 4 connected to the high refractive index layers 24 (for example, $Al_{0.12}Ga_{0.88}As$ layers) configuring the first mirror layer 20 which are laminated on each other.

The second areas 62 are provided on lateral portions of the second mirror layer 40 configuring the laminated body 2. The second areas 62 include a plurality of oxide layers 16 which are provided to be connected to the second mirror layer 40. Specifically, the second areas 62 are configured with the oxide layers 16 obtained by oxidizing layers connected to the low refractive index layers 46 (for example, $Al_{0.9}Ga_{0.1}As$ layers) configuring the second mirror layer 40, and layers 14 connected to the high refractive index layers 44 (for example, $Al_{0.12}Ga_{0.88}As$ layers) configuring the second mirror layer 40 which are laminated on each other. In a plan view (when seen from the lamination direction of the first mirror layer 20 and the active layer 30), oxide areas 8 are configured by the first areas 60 and the second areas 62.

The first mirror layer 20, the active layer 30, the second mirror layer 40, the current constriction layer 42, the contact layer 50, the first areas 60, and the second areas 62 configure the laminated body 2. In the example shown in FIGS. 1 and 2, the laminated body 2 is surrounded with the resin layer 70.

In the example shown in FIG. 3, in a plan view, a length of the laminated body 2 in a Y axis direction is greater than a length of the laminated body 2 in an X axis direction. That is, a longitudinal direction of the laminated body 2 is in the Y axis direction. In a plan view, the laminated body 2 is, for example, symmetrical about a virtual straight line which passes through the center of the laminated body 2 and is parallel to the X axis. In a plan view, the laminated body 2 is, for example, symmetrical about a virtual straight line which passes through the center of the laminated body 2 and is parallel to the Y axis.

In a plan view as shown in FIG. 3, the laminated body 2 includes a first distortion imparting portion (first portion or arm) 2a, a second distortion imparting portion (second portion or arm) 2b, and a resonance portion (third portion or body) 2c.

In a plan view, the first distortion imparting portion 2a and the second distortion imparting portion 2b face each other in the Y axis direction with the resonance portion 2c interposed therebetween (the first and second distortion imparting portions 2a and 2b extend from opposite ends of the resonance portion 2c). In a plan view, the first distortion imparting portion 2a is protruded from the resonance portion 2c in the positive Y axis direction. In a plan view, the second distortion imparting portion 2b is protruded from the resonance portion 2c in the negative Y axis direction. The first distortion imparting portion 2a and the second distortion imparting portion 2b are provided to be integrated with the resonance portion 2c.

The first distortion imparting portion 2a and the second distortion imparting portion 2b impart distortion to the active layer 30 and polarize light generated in the active layer 30. Herein, to polarize the light is to set a vibration direction of an electric field of the light to be constant. The semiconductor layers (the first mirror layer 20, the active layer 30, the second mirror layer 40, the current constriction layer 42, the contact layer 50, the first areas 60, and the second areas 62) configuring the first distortion imparting portion 2a and the second distortion imparting portion 2b are a generation source which generates distortion to be imparted to the active layer 30. Since the first distortion imparting portion 2a and the second distortion imparting portion 2b include the first areas 60 including the plurality of oxide layers 6 and the second areas 62 including the plurality of oxide layers 16, it is possible to impart a large amount of distortion to the active layer 30.

The resonance portion 2c is provided between the first distortion imparting portion 2a and the second distortion imparting portion 2b. A length of the resonance portion 2c in the X axis direction is greater than a length of the first distortion imparting portion 2a in the X axis direction or a length of the second distortion imparting portion 2b in the X axis direction. A planar shape of the resonance portion 2c (shape when seen from the lamination direction of the first mirror layer 20 and the active layer 30) is, for example, a circle (circular).

The resonance portion 2c resonates light generated in the active layer 30. That is, the vertical oscillator is formed in the resonance portion 2c.

The resin layer 70 is provided at least along the side surfaces of the laminated body 2. In the example shown in FIG. 1, the resin layer 70 covers the first distortion imparting portion 2a and the second distortion imparting portion 2b. That is, the resin layer 70 is provided on the side surfaces of the first distortion imparting portion 2a, the upper surface of the first distortion imparting portion 2a, the side surfaces of the second distortion imparting portion 2b, and the upper surface of the second distortion imparting portion 2b. The resin layer 70 may completely cover the first distortion imparting portion 2a and the second distortion imparting portion 2b, or may cover some of the first distortion imparting portion 2a and the second distortion imparting portion 2b. The material of the resin layer 70 is, for example, polyimide.

In the example shown in FIG. 1 (and also FIG. 5), in a plan view, a length of the resin layer 70 in the Y axis direction is greater than a length of the resin layer 70 in the X axis direction. That is, a longitudinal direction of the resin layer 70 is in the Y axis direction. The longitudinal direction of the resin layer 70 and the longitudinal direction of the laminated body 2 coincide with each other.

The first electrodes 80 are provided on the first mirror layer 20. The first electrodes 80 have ohmic contact with the first mirror layer 20. The first electrodes 80 are electrically connected to the first mirror layer 20. As the first electrodes 80, an electrode in which a Cr layer, an AuGe layer, an Ni layer, and an Au layer are laminated in this order from the first mirror layer 20 side is used, for example. The first electrodes 80 are the electrodes for injecting the current to the active layer 30. Although not shown, the first electrodes 80 may be provided on the lower surface of the substrate 10.

The second electrodes 82 are provided on the contact layer 50 (on the laminated body 2). The second electrodes 82 have ohmic contact with the contact layer 50. In the example shown in the drawing, the second electrodes 82 are also formed on the resin layer 70. The second electrodes 82 are electrically connected to the second mirror layer 40 through the contact layer 50. As the second electrodes 82, an electrode in which a Cr layer, a Pt layer, a Ti layer, a Pt layer, and an Au layer are laminated in this order from the contact layer 50 side is used, for example. The second electrodes 82 are the other electrodes for injecting the current to the active layer 30.

The second electrodes 82 are electrically connected to a pad 84. In the example shown in the drawing, the second electrodes 82 are electrically connected to the pad 84 through a lead-out wiring 86. The pad 84 is provided on the resin layer 70. The material of the pad 84 and the lead-out wiring 86 is, for example, the same as the material of the second electrodes 82.

Herein, the laminated body 2 will be described in more detail. The laminated body 2 includes the first distortion imparting portion 2a having a first width (length/dimension in the X axis direction), the second distortion imparting portion 2b having a second width, and the resonance portion 2c having a third width wider than the first width and the second width. In the example shown in the drawing, the first width and the second width have the same width as each other.

The first width is, for example, a maximum width along the width of the first distortion imparting portion 2a, in a direction (X axis direction) orthogonal to a direction (Y axis direction) in which the first distortion imparting portion 2a and the second distortion imparting portion 2b face each other or extend. The second width is, for example, a maximum width along the width of the second distortion imparting portion 2b, in the direction orthogonal to the direction in which the first distortion imparting portion 2a and the second distortion imparting portion 2b face each other or extend. The third width is, for example, a maximum width along the width of the resonance portion 2c, in the direction orthogonal to the direction in which the first distortion imparting portion 2a and the second distortion imparting portion 2b face each other or extend.

In a plan view, the oxide area 8 is configured with the first area 60 and the second area 62 of the first distortion imparting portion 2a. In a plan view, when a width of the oxide area 8 (size in the X axis direction) is set as W1 and a width of an upper surface 48 of the second mirror layer 40 of the first distortion imparting portion 2a is set as W2, W2/W1≤3.3, and preferably 1.3≤W2/W1≤2.2. For example, when a width of the oxide area 8 of the second distortion imparting portion 2b is set as W3 (not shown), a relationship of 1.3≤W2/W3≤2.2 is satisfied.

In a plan view, when a virtual straight line L orthogonal to the direction (Y axis direction) in which the first distortion imparting portion 2a and the second distortion imparting portion 2b face each other or extend is drawn on the first distortion imparting portion 2a, the width W2 which is the width of the upper surface 48 of the second mirror layer 40 is measured on the virtual straight line L. That is, the virtual straight line L is parallel to the X axis, and the width W2 is a linear dimension of the upper surface 48 of the second mirror layer 40 in the X axis direction.

In the example shown in FIG. 3, in a plan view, a first portion 8a and a second portion 8b of the oxide area 8 are provided in a position overlapped with (crossing) the virtual straight line L so as to interpose the upper surface 48 of the second mirror layer 40 therebetween. That is, the first portion 8a and the second portion 8b interpose the upper surface 48 in the X axis direction. In the example shown in the drawing, the first portion 8a is provided on the positive X axis direction side of the upper surface 48 of the second mirror layer 40 and the second portion 8b is provided on the negative X axis direction side of the upper surface 48. The width W1 which is the width of the oxide area 8 is a width of the first portion 8a and is measured on the virtual straight line L. That is, the width W1 is a linear dimension of the first portion 8a of the oxide area 8 in the X axis direction.

In the example shown in FIG. 4, in a cross-sectional view, a lowest (e.g., lowermost) oxide layer 6a among the plurality of oxide layers 6 in the first area 60 includes a first end-face 6c opposite an end-face 6b which comes in contact with the first mirror layer 20 of the first distortion imparting portion 2a. In a cross-sectional view, a highest (e.g., topmost) oxide layer 16a among the plurality of oxide layers 16 in the second area 62 includes a second end-face 16b which comes in contact with the second mirror layer 40 of the first distortion imparting portion 2a. In a plan view, the width W1 is a width from the first end-face 6c to the second end-face 16b.

As shown in FIG. 4, the first area 60 includes a first portion 60a and a second portion 60b. In a cross-sectional view, the first portion 60a and the second portion 60b of the first area 60 are provided so as to interpose the first mirror layer 20 of the first distortion imparting portion 2a therebetween. In the example shown in the drawing, the first portion 60a is provided on the positive X axis direction side of the first mirror layer 20 and the second portion 60b is provided on the negative X axis direction side of the first mirror layer 20. The first portion 60a of the first area 60 includes the lowest oxide layer 6a.

The second area 62 includes a first portion 62a and a second portion 62b. In a cross-sectional view, the first portion 62a and the second portion 62b of the second area 62 are provided so as to interpose the second mirror layer 40 of the first distortion imparting portion 2a therebetween. The first portion 62a of the second area 62 is provided over the first portion 60a of the first area 60. The second portion 62b of the second area 62 is provided over the second portion 60b of the first area 60. The first portion 62a of the second area 62 includes the highest oxide layer 16a.

An upper surface 63 in the second area 62 is inclined relative to the substrate 10. In the example shown in the drawing, the upper surface 63 in the second area 62 is inclined toward the substrate 10 side with respect to the upper surface 48 of the second mirror layer 40.

Figure 5:
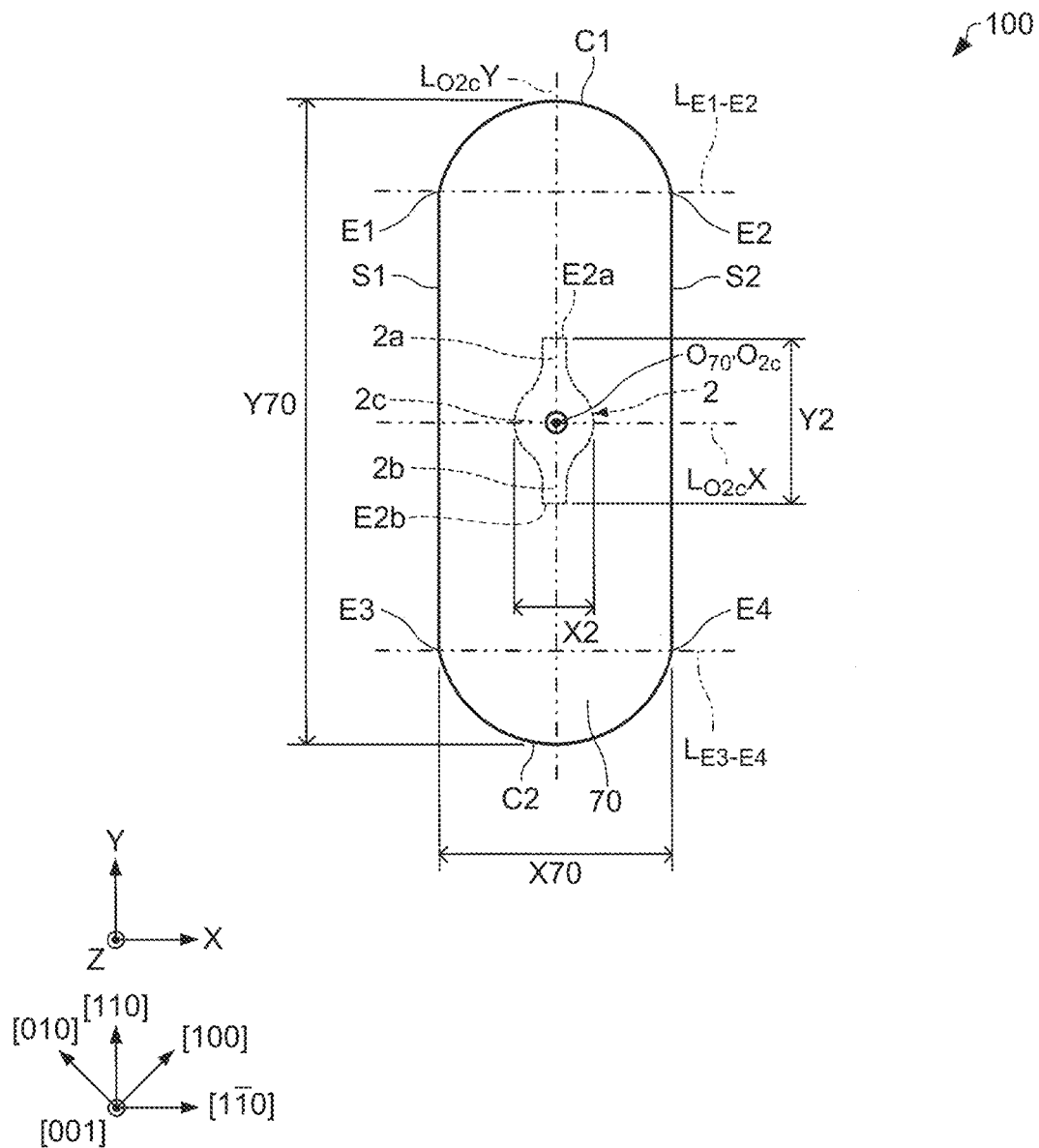
FIG. 5 is a plan view schematically showing a vertical cavity surface emitting laser according to a first embodiment.

FIG. 5 is a plan view schematically showing the vertical cavity surface emitting laser 100. In FIG. 5, members other than the laminated body 2 and the resin layer 70 are omitted, for the sake of convenience. Hereinafter, the laminated body 2 and the resin layer 70 will be described in detail with reference to FIG. 5.

In a plan view, a length Y2 of the laminated body 2 in the Y axis direction is greater than a width X2 of the laminated body 2 in the X axis direction. Herein, the length Y2 of the laminated body 2 in the Y axis direction is, for example, the greatest length along the Y direction of the laminated body 2. In the example shown in FIG. 5, the length Y2 of the laminated body 2 is a distance in the Y axis direction between an end E2a of the first distortion imparting portion 2a on the positive Y axis direction side and an end E2b of the second distortion imparting portion 2b on the negative Y axis direction side. The width X2 of the laminated body 2 in the X axis direction is, for example, the greatest width along the X direction of the laminated body 2. In the example shown in FIG. 5, the width X2 of the laminated body 2 is a width of the resonance portion 2c in the X axis direction.

In a plan view, a length Y70 of the resin layer 70 in the Y axis direction is greater than a width X70 of the resin layer 70 in the X axis direction. Herein, the length Y70 of the resin layer 70 in the Y axis direction is, for example, the greatest length of the resin layer 70 in the Y axis direction. In the example shown in FIG. 5, the length Y70 of the resin layer 70 is a distance in the Y axis direction between an end of a first curved edge C1 on the positive Y axis direction side and an end of a second curved edge C2 on the negative Y axis direction side. The width X70 of the resin layer 70 in the X axis direction is, for example, the greatest width of the resin layer 70 in the X axis direction. In the example shown in FIG. 5, the width X70 of the resin layer 70 is a distance in the X axis direction between a first straight edge S1 and a second straight edge S2.

As described above, in the vertical cavity surface emitting laser 100, in a plan view, the longitudinal direction of the laminated body 2 and the longitudinal direction of the resin layer 70 are in the same direction (Y axis direction). Accordingly, in the vertical cavity surface emitting laser 100, it is possible to stabilize the polarization direction of the laser light. The reason thereof will be described later.

The width of the resonance portion 2c in the X axis direction is greater than the width of the first distortion imparting portion 2a in the X axis direction and the width of the second distortion imparting portion 2b in the X axis direction. Herein, the width of the resonance portion 2c in the X axis direction is, for example, the greatest width in the X axis direction along the length of the resonance portion 2c. The width of the first distortion imparting portion 2a in the X axis direction is, for example, the greatest width in the X axis direction along the length of the first distortion imparting portion 2a. The width of the second distortion imparting portion 2b in the X axis direction is, for example, the greatest width in the X axis direction along the length of the second distortion imparting portion 2b.

In a plan view, an outer rim of the resin layer 70 includes a first straight edge S1, a second straight edge S2 opposite the first straight edge S1, the first curved edge C1 which connects the first straight edge S1 and the second straight edge S2 to each other, and the second curved edge C2 which is opposite the first curved edge C1 and connects the first straight edge S1 and the second straight edge S2 to each other. The first straight edge S1 and the second straight edge S2 are parallel with each other. In the example shown in the drawing, the first straight edge S1 and the second straight edge S2 are parallel with the Y axis. The first curved edge C1 and the second curved edge C2, for example, have the same radius of curvature. The first curved edge C1 is positioned on the positive Y axis direction side of the resonance portion 2c and the second curved edge C2 is positioned on the negative Y axis direction side of the resonance portion 2c. Herein, in a plan view, the outer rim of the resin layer 70 is, for example, a rim of the outermost sides of the resin layer 70.

In a plan view, the first distortion imparting portion 2a and the first curved edge C1 are positioned on the same side (positive Y axis direction side) when seen from the resonance portion 2c. In a plan view, when an end of the first straight edge S1 coming in contact with the first curved edge C1 is set as a first end or intersect E1, an end of the second straight edge S2 coming in contact with the first curved edge C1 is set as a second end or intersect E2, and a virtual straight line (first virtual straight line) $L_{E1\text{-}E2}$ passing through the first end E1 and the second end E2 is drawn, the end E2a of the first distortion imparting portion 2a is positioned (offset) on the resonance portion 2c side (negative Y axis direction side) when seen from the virtual straight line $L_{E1\text{-}E2}$. That is, in a plan view, the first distortion imparting portion 2a does not intersect with the virtual straight line $L_{E1\text{-}E2}$. The end E2a of the first distortion imparting portion 2a can also be referred to as an end of the laminated body 2 on the positive Y axis direction side.

In the same manner as described above, in a plan view, the second distortion imparting portion 2b and the second curved edge C2 are positioned on the same side (negative Y axis direction side) when seen from the resonance portion 2c. Herein, in a plan view, when an end of the first straight edge S1 coming in contact with the second curved edge C2 is set as a third end or intersect E3, an end of the second straight edge S2 coming in contact with the second curved edge C2 is set as a fourth end or intersect E4, and a virtual straight line $L_{E3\text{-}E4}$ passing through the third end E3 and the fourth end E4 is drawn, the end E2b of the second distortion imparting portion 2b is positioned (offset) on the resonance portion 2c side (positive Y axis direction side) when seen from the virtual straight line $L_{E3\text{-}E4}$. That is, in a plan view, the second distortion imparting portion 2b does not intersect with the virtual straight line $L_{E3\text{-}E4}$. The end E2b of the second distortion imparting portion 2b can also be referred to as an end of the laminated body 2 on the negative Y axis direction side.

In a plan view, the resin layer 70 has a line-symmetrical shape with respect to a virtual straight line (third virtual straight line) $L_{O2c}X$ in the X axis direction passing through a center $O_{2c}$ of the resonance portion 2c. In a plan view, the resin layer 70 has a line-symmetrical shape with respect to a virtual straight line $L_{O2c}Y$ in the Y axis direction passing through the center $O_{2c}$ of the resonance portion 2c. A center $O_{70}$ of the resin layer 70 and the center $O_{2c}$ of the resonance portion 2c, for example, coincide with each other.

A planar shape of the resin layer 70 is not particularly limited, as long as it is a longitudinally extending shape. The planar shape of the resin layer 70, for example, may be a rectangle having a long side parallel to the Y axis direction. The planar shape of the resin layer 70, for example, may be a line-asymmetrical shape with respect to the virtual straight line $L_{O2c}X$ or $L_{O2c}Y$. The center $O_{2c}$ of the resonance portion 2c and the center $O_{70}$ of the resin layer 70 may not coincide with each other.

In the vertical cavity surface emitting laser 100, when the (001) GaAs substrate is used that has a main surface in the (001) plane as the substrate 10, the positive X axis direction is the [1-10] direction and the positive Y axis direction is the [110] direction. Accordingly, the longitudinal direction of the resin layer 70 and the longitudinal direction of the laminated body 2 are in the [110] direction. The first distortion imparting portion 2a extends from the resonance portion 2c in the [110] direction and the second distortion imparting portion 2b extends from the resonance portion 2c in the [−1−10] direction. As shown in FIG. 1, a planar shape of the vertical cavity surface emitting laser 100 (planar shape of the substrate 10) is a rectangle (including a square), and is configured with two sides parallel to the [110] direction and two sides parallel to the [1-10] direction.

The longitudinal direction of the resin layer 70 and the longitudinal direction of the laminated body 2 are not limited to the [110] direction, and can be, for example, in the <110> direction.

As described above, in the vertical cavity surface emitting laser 100, the longitudinal direction of the laminated body 2 can be in the <110> direction. Accordingly, the planar shape of the opening 43 of the current constriction layer 42 (see FIG. 3) can be respectively symmetrical about an axis which passes through the center of the opening 43 and is parallel to the X axis and an axis which passes through the center of the opening 43 and is parallel to the Y axis. Hereinafter, the reason thereof will be described.

The current constriction layer 42 is formed by oxidizing a semiconductor layer (layer to be oxidized 42a which will be described later) from the side surface of the laminated body 2. In the (001) GaAs substrate, an oxidation rate in the <100> direction is high. Accordingly, a planar shape of the opening 43 of the current constriction layer 42 is formed by tracing the shape of the outer rim of the laminated body 2 in the [100] direction, the [010] direction, the [−100] direction, and the [0−10] direction, when seen from the center of the opening 43.

In the vertical cavity surface emitting laser 100, since the longitudinal direction of the laminated body 2, that is, the direction in which the first distortion imparting portion 2a and the second distortion imparting portion 2b extend, is the <110> direction (in the example shown in the drawing, the [110] direction and the [−1−10] direction), the opening 43 of the current constriction layer 42 can have the shape respectively symmetrical about an axis which passes through the center of the opening 43 and is parallel to the X axis and an axis which is parallel to the Y axis, by tracing the shape of the outer rim of the laminated body 2 in the [100] direction, the [010] direction, the [−100] direction, and the [0−10] direction.

For example, when the longitudinal direction of the laminated body 2, that is, the longitudinal direction of the distortion imparting portions 2a and 2b is a direction other than the <110> direction, the planar shape of the opening 43 is not the shape respectively symmetrical (i.e., it's asymmetrical) about an axis which passes through the center of the opening 43 and is parallel to the X axis and an axis which passes through the center of the opening 43 and is parallel to the Y axis and becomes an irregular shape.

In the example shown in FIG. 3, the planar shape of the opening 43 of the current constriction layer 42 is a rhombus having a diagonal line parallel to the Y axis direction which is longer than a diagonal line parallel to the X axis direction. The planar shape of the opening 43 of the current constriction layer 42 may be a rhombus having angles or sides having a curvature.

Herein, the example in which the longitudinal direction of the resin layer 70 and the longitudinal direction of the laminated body 2 are the [110] direction has been described, but the crystal plane orientation is not particularly limited, as long as the longitudinal direction of the resin layer 70 and the longitudinal direction of the laminated body 2 coincide with each other.

In the above description, the AlGaAs vertical cavity surface emitting laser has been described, but GaInP, ZnSSe, InGaN, AlGaN, InGaAs, GaInNAs, or GaAsSb semiconductor materials may be used according to the oscillation wavelength, for the vertical cavity surface emitting laser according to the invention.

The vertical cavity surface emitting laser 100, for example, has the following characteristics.

In the vertical cavity surface emitting laser 100, the length Y2 of the laminated body 2 in the Y axis direction is greater than the width X2 of the laminated body 2 in the X axis direction, in a plan view, and the length Y70 of the resin layer 70 in the Y axis direction is greater than the width X70 of the resin layer 70 in the X axis direction, in a plan view. Accordingly, in the vertical cavity surface emitting laser 100, the stress can be applied to the active layer 30 by both of the distortion imparting portions 2a and 2b and the resin layer 70, and it is possible to stabilize the polarization direction of the laser light (see experimental examples which will be described later). Therefore, it is possible to further stabilize the polarization direction of the laser light, compared to a case where the stress is applied to the active layer 30 by only the resin layer 70 (or distortion imparting portions 2a and 2b), for example.

As described above, in the vertical cavity surface emitting laser 100, since it is possible to stabilize the polarization direction of the laser light, it is possible to stably emit circularly polarized light to the gas cell through a λ/4 plate, when the vertical cavity surface emitting laser 100 is used as a light source of the atomic oscillator, for example. As a result, it is possible to increase the frequency stability of the atomic oscillator. For example, when the polarization direction of the laser light emitted from the vertical cavity surface emitting laser is not stable, the light obtained through the λ/4 plate may be elliptically polarized light or a rotation direction of the circularly polarized light may be fluctuated.

As described above, in the vertical cavity surface emitting laser 100, since it is possible to stabilize the polarization direction of the laser light, it is possible to stably emit the circularly polarized light to the gas cell through the λ/4 plate, and to increase the frequency stability of the atomic oscillator.

In the vertical cavity surface emitting laser 100, in a plan view, the outer rim of the resin layer 70 includes the first straight edge S1, the second straight edge S2 facing the first straight edge S1, the first curved edge C1 which connects the first straight edge S1 and the second straight edge S2 to each other, and the second curved edge C2 which faces the first curved edge C1 and connects the first straight edge S1 and the second straight edge S2 to each other. Accordingly, the stress is not concentrated on the portion where the first straight edge S1, the second straight edge S2, and the first curved edge C1 are connected to each other, compared to a case where the first curved edge C1 has a straight line shape. Therefore, cracks rarely occur in the portion described above. In addition, cracks rarely occur in a portion where the first straight edge S1, the second straight edge S2, and the second curved edge C2 are connected to each other, for the same reason.

In the vertical cavity surface emitting laser 100, when the first distortion imparting portion 2a and the first curved edge C1 are positioned on the same side when seen from the resonance portion 2c in a plan view, the end of the first straight edge S1 coming in contact with the first curved edge C1 is set as the first end E1, the end of the second straight edge S2 coming in contact with the first curved edge C1 is set as the second end E2, and the virtual straight line $L_{E1-E2}$ passing through the first end E1 and the second end E2 is drawn, in a plan view, the end portion E2a of the first distortion imparting portion 2a is positioned on the resonance portion 2c side when seen from the virtual straight line. Accordingly, even if cracks occur in the portion where the first straight edge S1, the second straight edge S2, and the first curved edge C1 are connected to each other, since the end portion E2a of the first distortion imparting portion 2a is positioned on the resonance portion 2c side which is the inner side with respect to the portion described above, it is possible to suppress the cracks from reaching the first distortion imparting portion 2a. Therefore, in the vertical cavity surface emitting laser 100, it is possible to increase protection performance with respect to the laminated body 2.

In the same manner as described above, in the vertical cavity surface emitting laser 100, in a plan view, when the end of the first straight edge S1 coming in contact with the second curved edge C2 is set as the third end E3, the end of the second straight edge S2 coming in contact with the second curved edge C2 is set as the fourth end E4, and the virtual straight line $L_{E3\text{-}E4}$ passing through the third end E3 and the fourth end E4 is drawn, the end portion E2b of the second distortion imparting portion 2b is positioned on the resonance portion 2c side when seen from the virtual straight line $L_{E3\text{-}E4}$. Accordingly, even if cracks occur in the portion where the first straight edge S1, the second straight edge S2, and the second curved edge C2 are connected to each other, it is possible to suppress the cracks from reaching the second distortion imparting portion 2b.

In the vertical cavity surface emitting laser 100, in a plan view, the resin layer 70 has a shape line-symmetrical with respect to the virtual straight line $L_{O2c}X$ in the X axis direction passing through the center $O_{2c}$ of the resonance portion 2c. Accordingly, in the vertical cavity surface emitting laser 100, it is possible to stabilize the polarization direction of the laser light.

In the vertical cavity surface emitting laser 100, the material of the resin layer 70 is polyimide. Herein, the polyimide is a resin which is hardened by applying heat. The polyimide contracts in a heating step (curing step) of hardening the polyimide. In addition, the polyimide contracts when returning the temperature in the heating step to a room temperature. It is possible to apply great stress with respect to the active layer 30 with this contraction of the polyimide. Accordingly, in the vertical cavity surface emitting laser 100, it is possible to stabilize the polarization direction of the laser light.

In the vertical cavity surface emitting laser 100, when, in a plan view, the oxide area 8 is configured with the first area 60 and the second area 62 of the first distortion imparting portion 2a, the width of the oxide area 8 is set as W1, and the width of the upper surface 48 of the second mirror layer 40 of the first distortion imparting portion 2a is set as W2, W2/W1≤3.3. Accordingly, in the vertical cavity surface emitting laser 100, it is possible to generate a large amount of distortion in the active layer 30 by the oxide area 8, and it is possible to stabilize the polarization direction of the laser light (see experimental examples which will be described later).

In the vertical cavity surface emitting laser 100, W2/W1≤2.2. Accordingly, in the vertical cavity surface emitting laser 100, it is possible to even further stabilize the polarization direction of the laser light (see experimental examples which will be described later).

In the vertical cavity surface emitting laser 100, 1.3≤W2/W1≤2.2. Accordingly, in the vertical cavity surface emitting laser 100, it is possible to even further stabilize the polarization direction of the laser light (see experimental examples which will be described later).

1.2. Manufacturing Method of Vertical Cavity Surface Emitting Laser

Next, a manufacturing method of the vertical cavity surface emitting laser according to the first embodiment will be described with reference to the drawings. FIGS. 6 to 9 are cross-sectional views schematically showing manufacturing steps of the vertical cavity surface emitting laser 100 according to the first embodiment, and correspond to FIG. 2.

Figure 6:
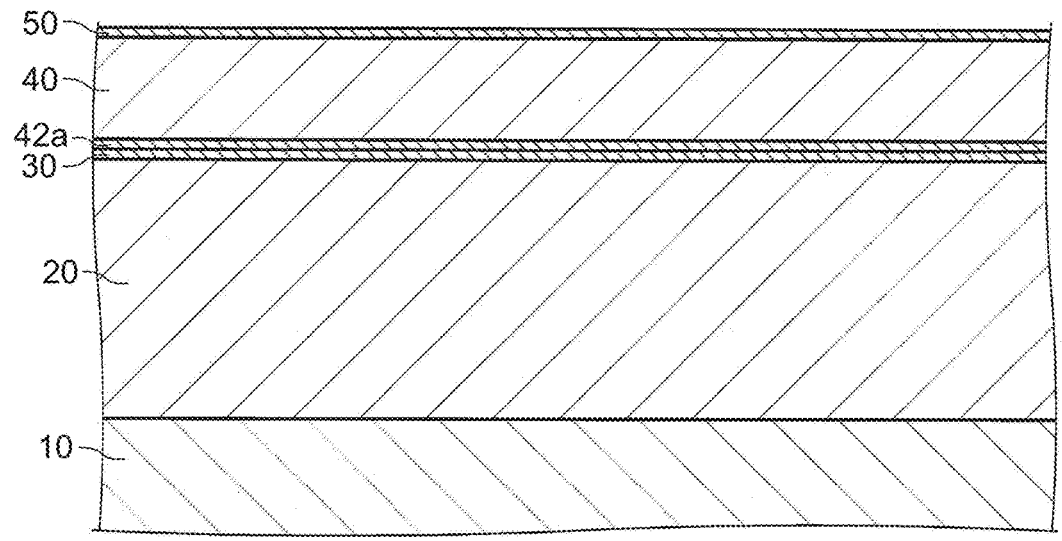
FIG. 6 is a cross-sectional view schematically showing a manufacturing step of a vertical cavity surface emitting laser according to a first embodiment.

As shown in FIG. 6, the first mirror layer 20, the active layer 30, the layer to be oxidized 42 a which is to be the oxidized current constriction layer 42, the second mirror layer 40, and the contact layer 50 are epitaxially grown in this order, on the substrate 10. As an epitaxial growth method, a metal organic chemical vapor deposition (MOCVD) method or a molecular beam epitaxy (MBE) method is used, for example.

Figure 7:
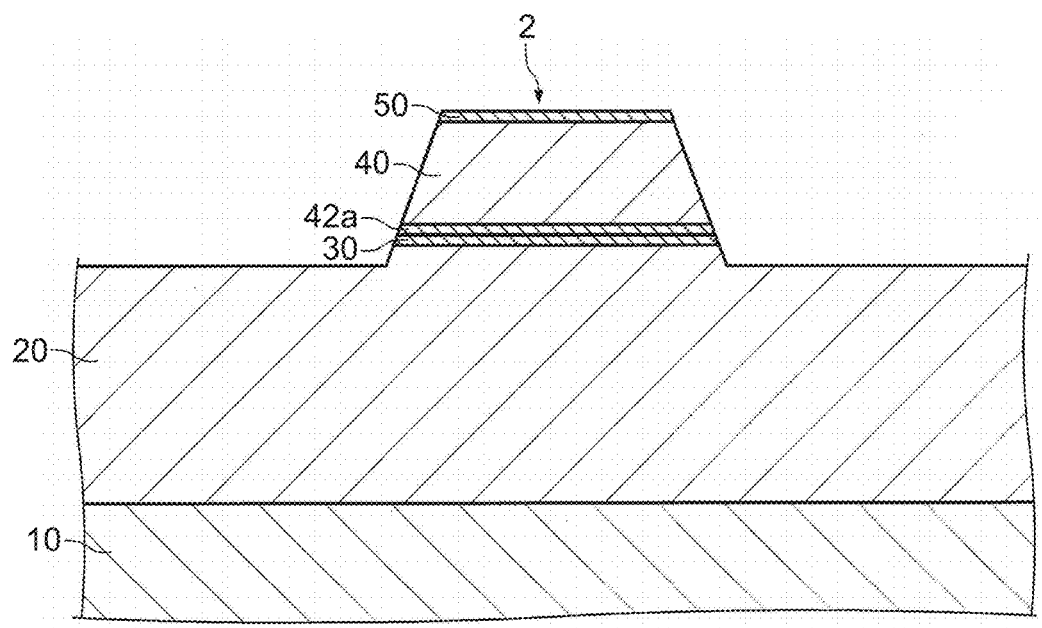
FIG. 7 is a cross-sectional view schematically showing a manufacturing step of a vertical cavity surface emitting laser according to a first embodiment.

As shown in FIG. 7, the contact layer 50, the second mirror layer 40, the layer to be oxidized 42a, the active layer 30, and first mirror layer 20 are patterned to form the laminated body 2. The patterning is performed by photolithography or etching, for example.

Figure 8:
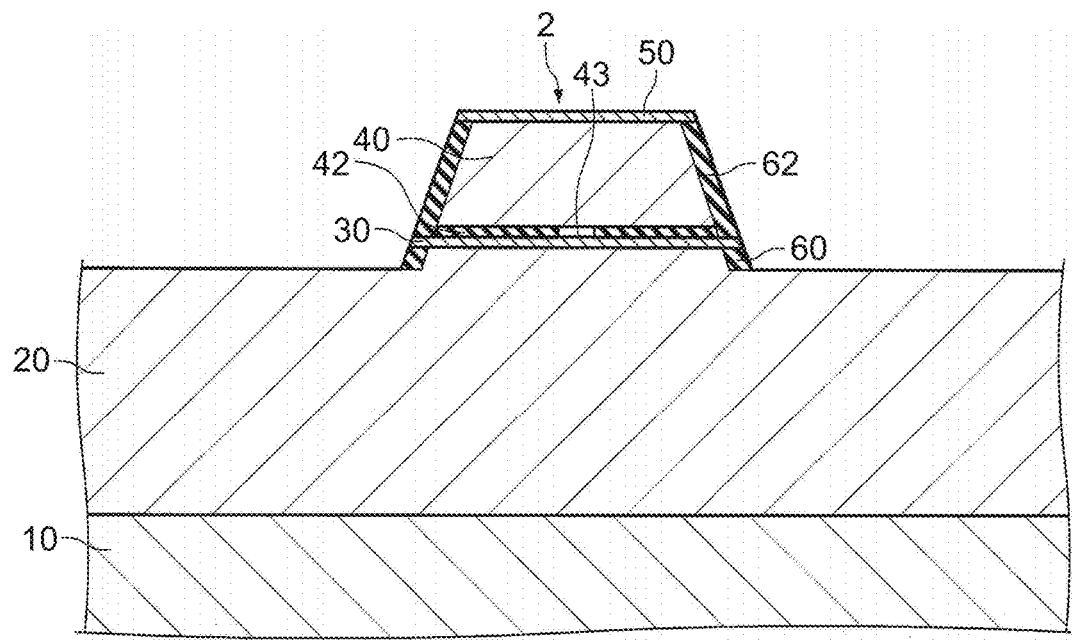
FIG. 8 is a cross-sectional view schematically showing a manufacturing step of a vertical cavity surface emitting laser according to a first embodiment.

As shown in FIG. 8, the layer to be oxidized 42a is oxidized to form the current constriction layer 42. The layer to be oxidized 42a is, for example, an $Al_xGa_{1-x}As$ (x≥0.95) layer. The substrate 10 on which the laminated body 2 is formed is put in a steam atmosphere at approximately 400° C., to oxidize the $Al_xGa_{1-x}As$ (x≥0.95) layer from the lateral side, and accordingly the current constriction layer 42 is formed.

In the manufacturing method of the vertical cavity surface emitting laser 100, in the oxidization step, a layer configuring the first mirror layer 20 is oxidized from the lateral side to form the first area 60. A layer configuring the second mirror layer 40 is oxidized from the lateral side to form the second area 62. Specifically, due to the steam atmosphere at approximately 400° C., arsenic in the $Al_{0.9}Ga_{0.1}As$ layer configuring the mirror layers 20 and 40 is substituted with oxygen, and the areas 60 and 62 are formed. The areas 60 and 62, for example, contract when returning the temperature from the high temperature of approximately 400° C. to the room temperature, and the upper surface 63 of the second area 62 is inclined to the substrate 10 side (see FIG. 4). The first distortion imparting portion 2a and the second distortion imparting portion 2b can apply distortion (stress) caused by the contraction of the areas 60 and 62 to the active layer 30.

Figure 9:
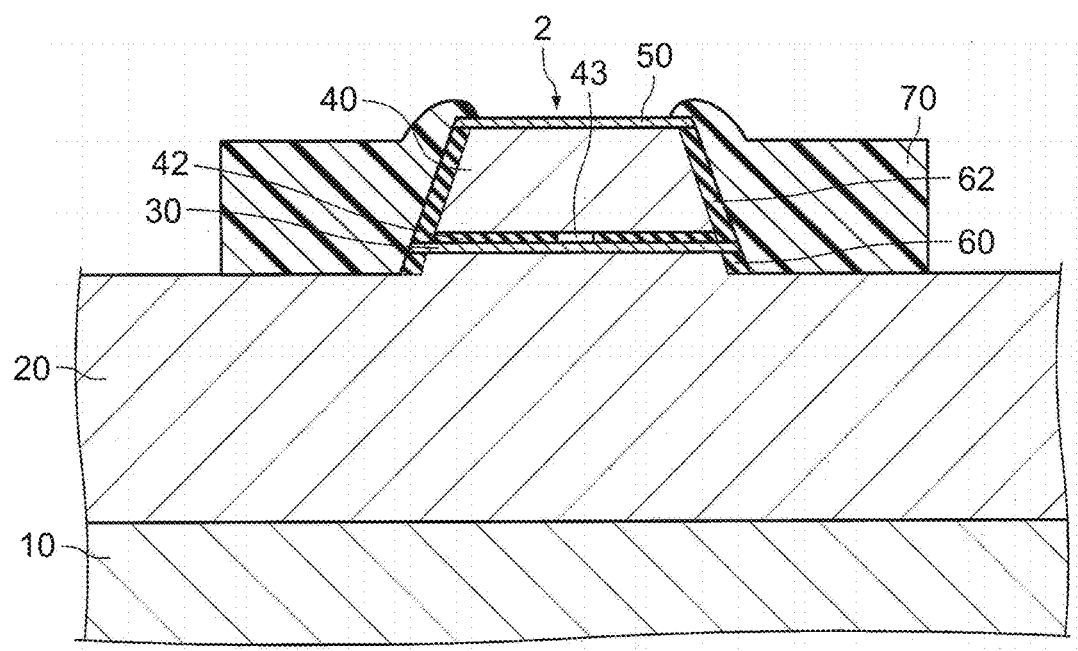
FIG. 9 is a cross-sectional view schematically showing a manufacturing step of a vertical cavity surface emitting laser according to a first embodiment.

As shown in FIG. 9, the resin layer 70 is formed so as to surround the laminated body 2. The resin layer 70 is formed, for example, by forming a layer formed of a polyimide resin on the upper surface of the first mirror layer 20 and the entire surface of the laminated body 2 using a spin coating method and patterning the layer. The patterning is performed by photolithography or etching, for example. Next, the resin layer 70 is hardened by performing a heating process (curing). The resin layer 70 contracts due to the heating process. In addition, the resin layer 70 contracts when returning the temperature in the heating step to a room temperature.

As shown in FIG. 2, the second electrode 82 is formed on the contact layer 50 and the resin layer 70, and the first electrode 80 is formed on the first mirror layer 20. The electrodes 80 and 82 are, for example, formed by a combination of a vacuum vapor deposition method and a lift-off method. The order of forming the electrodes 80 and 82 is not particularly limited. In the step of forming the second electrode 82, the pad 84 and the lead-out wiring 86 (see FIG. 1) may be formed.

It is possible to manufacture the vertical cavity surface emitting laser 100 with the steps described above.

1.3. Experimental Examples

Hereinafter, experimental examples will be described in detail. The invention is not limited by the following experimental examples.

1. First Experimental Example

Figure 10:
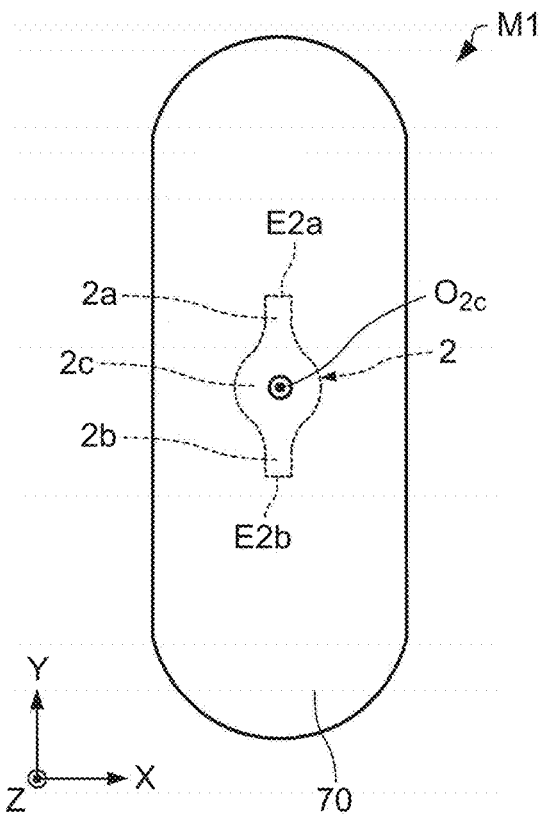
FIG. 10 is a plan view schematically showing a vertical cavity surface emitting laser according to a first experimental example.

First, a first experimental example will be described. FIG. 10 is a plan view schematically showing a vertical cavity surface emitting laser M1 according to the first experimental example. In FIG. 10, members other than the laminated body 2 and the resin layer 70 are omitted, for the sake of convenience.

In the vertical cavity surface emitting laser M1, the longitudinal direction of the laminated body 2 and the longitudinal direction of the resin layer 70 are the Y axis direction. A length (width) of the first distortion imparting portion 2a and the second distortion imparting portion 2b in the X axis direction is approximately 12 μm. A distance between the center $O_{2c}$ of the resonance portion 2c and the end portion E2a of the first distortion imparting portion 2a is approximately 50 μm. A diameter of the resonance portion 2c is approximately 20 μm. A length of the resin layer 70 in the Y axis direction is approximately 300 μm and a length of the resin layer 70 in the X axis direction is approximately 100 μm. The distortion imparting portions 2a and 2b are completely covered with the resin layer 70. The material of the resin layer 70 is polyimide. A configuration of the vertical cavity surface emitting laser M1 is the same as the configuration of the vertical cavity surface emitting laser 100 described above.

In this experimental example, light output of the vertical cavity surface emitting laser M1 is measured with a polarization filter. Specifically, a predetermined current (in this experiment, 2 mA) for single-mode oscillation is supplied to the vertical cavity surface emitting laser M1 and the light emitted from the vertical cavity surface emitting laser M1 is caused to pass through the polarization filter having a polarization transmission axis in the X axis direction, to measure the light output. The plurality of vertical cavity surface emitting lasers M1 are prepared and the above measurement is performed.

Figure 11:
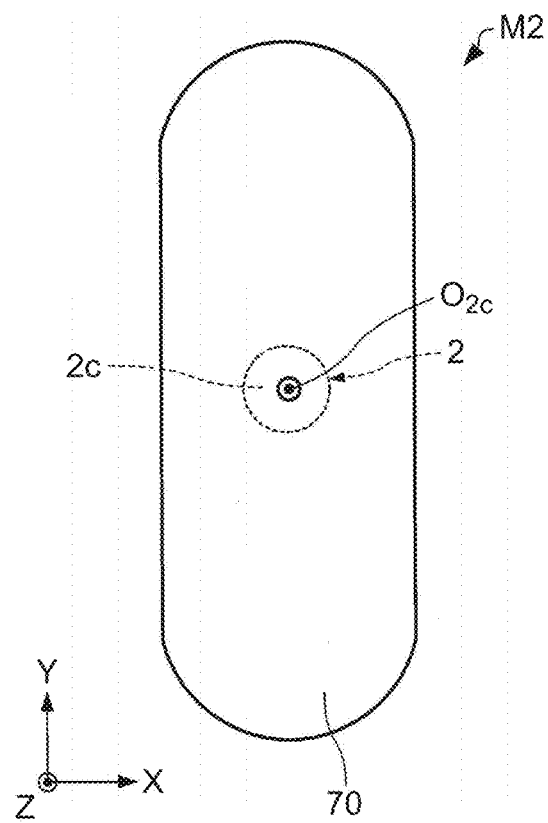
FIG. 11 is a plan view schematically showing a vertical cavity surface emitting laser according to a reference example.
Figure 12:
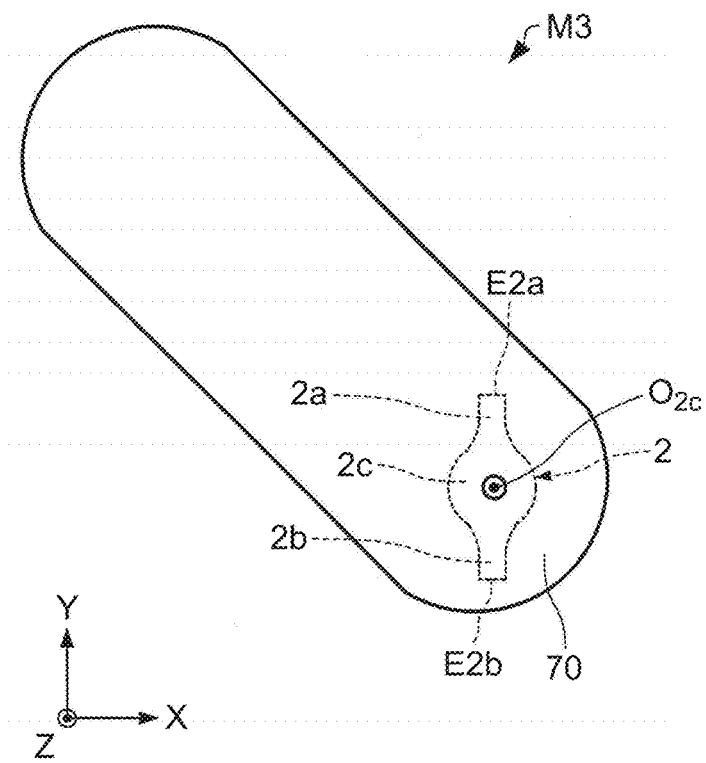
FIG. 12 is a plan view schematically showing a vertical cavity surface emitting laser according to a reference example.
Figure 13:
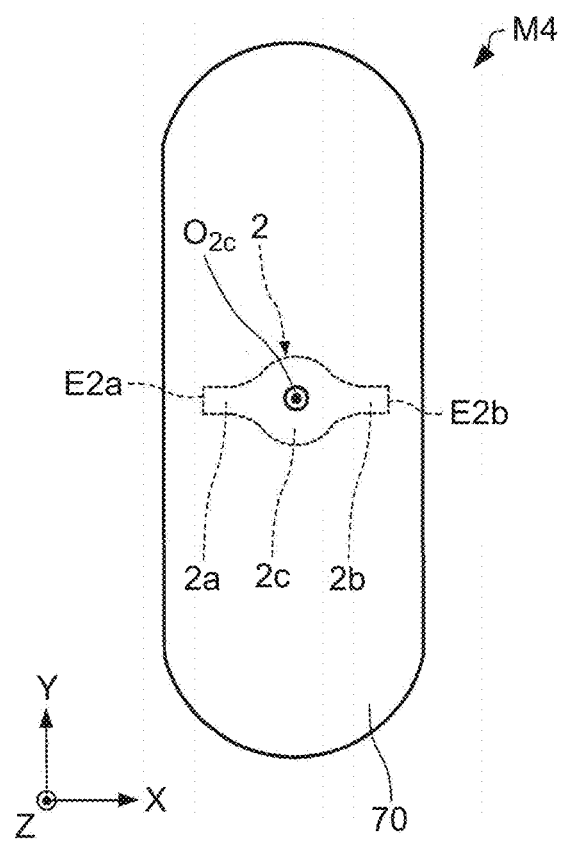
FIG. 13 is a plan view schematically showing a vertical cavity surface emitting laser according to a reference example.

As reference examples, vertical cavity surface emitting lasers M2, M3, and M4 are prepared. FIGS. 11 to 13 are plan views schematically showing the vertical cavity surface emitting lasers M2, M3, and M4 according to reference examples. In FIGS. 11 to 13, members other than the laminated body 2 and the resin layer 70 are omitted, for the sake of convenience.

As shown in FIG. 11, the vertical cavity surface emitting laser M2 is different from the vertical cavity surface emitting laser M1 in a point where the distortion imparting portions 2a and 2b are not provided. A planar shape of the laminated body 2 of the vertical cavity surface emitting laser M2 is a circle.

As shown in FIG. 12, the vertical cavity surface emitting laser M3 is different from the vertical cavity surface emitting laser M1 in a point where the longitudinal direction of the laminated body 2 and the longitudinal direction of the resin layer 70 are different from each other, in a plan view. Specifically, in the vertical cavity surface emitting laser M3, the longitudinal direction of the laminated body 2 is the Y axis direction and the longitudinal direction of the resin layer 70 is a direction inclined with respect to the Y axis by 45 degrees. In addition, the center $O_{2c}$ of the resonance portion 2c and the center of the resin layer 70 do not coincide with each other.

As shown in FIG. 13, the vertical cavity surface emitting laser M4 is different from the vertical cavity surface emitting laser M1 in a point where the longitudinal direction of the laminated body 2 and the longitudinal direction of the resin layer 70 are different from each other, in a plan view. Specifically, in the vertical cavity surface emitting laser M4, the longitudinal direction of the laminated body 2 is the X axis direction and the longitudinal direction of the resin layer 70 is the Y axis direction.

The vertical cavity surface emitting lasers M2, M3, and M4 have the same configuration as the vertical cavity surface emitting laser M1, except for the above points.

The light output is also measured in regards to the vertical cavity surface emitting lasers M2, M3, and M4 with the same method as in the case of the vertical cavity surface emitting laser M1.

Figure 14:
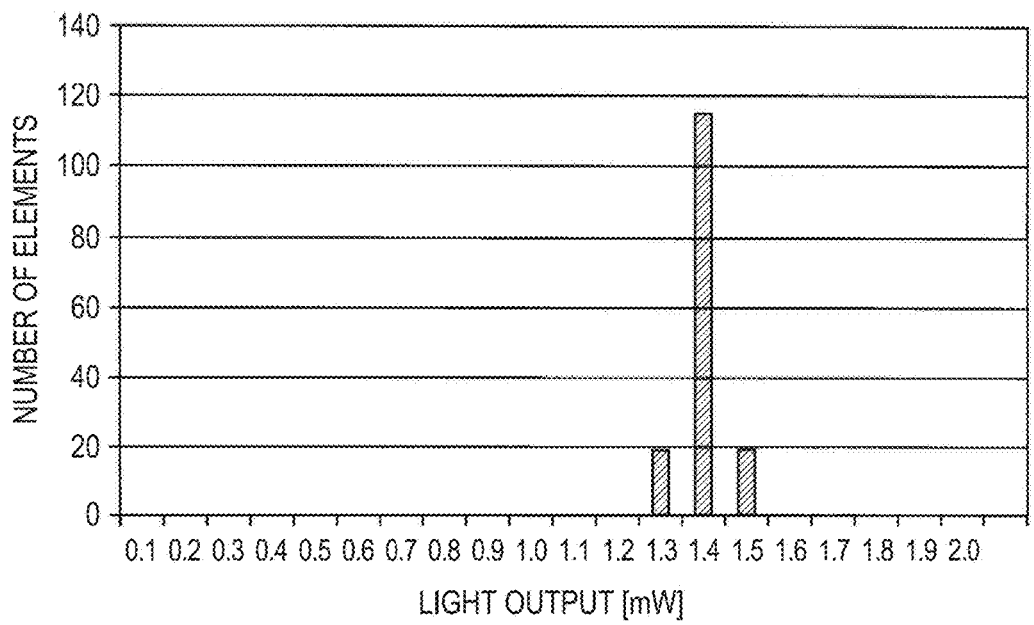
FIG. 14 is a histogram showing an experimental result of a vertical cavity surface emitting laser according to a first experimental example.
Figure 15:
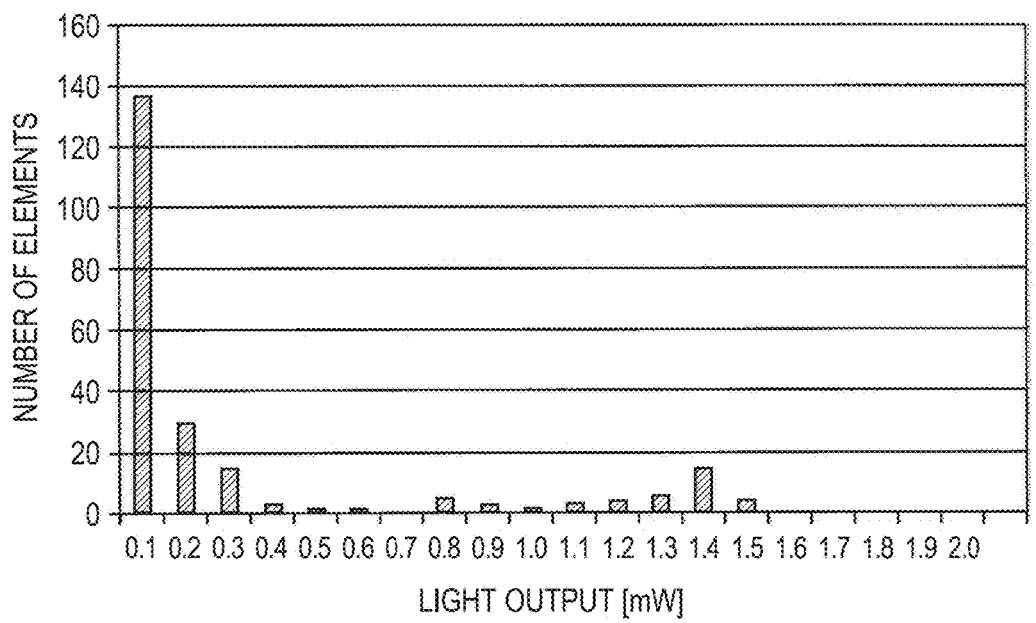
FIG. 15 is a histogram showing an experimental result of a vertical cavity surface emitting laser according to a reference example.
Figure 16:
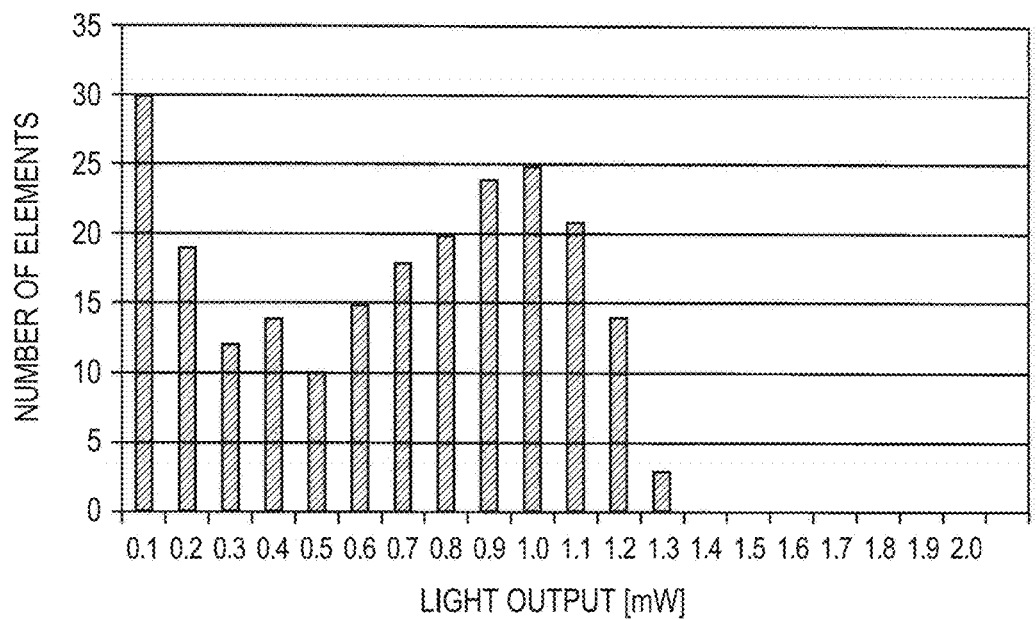
FIG. 16 is a histogram showing an experimental result of a vertical cavity surface emitting laser according to a reference example.
Figure 17:
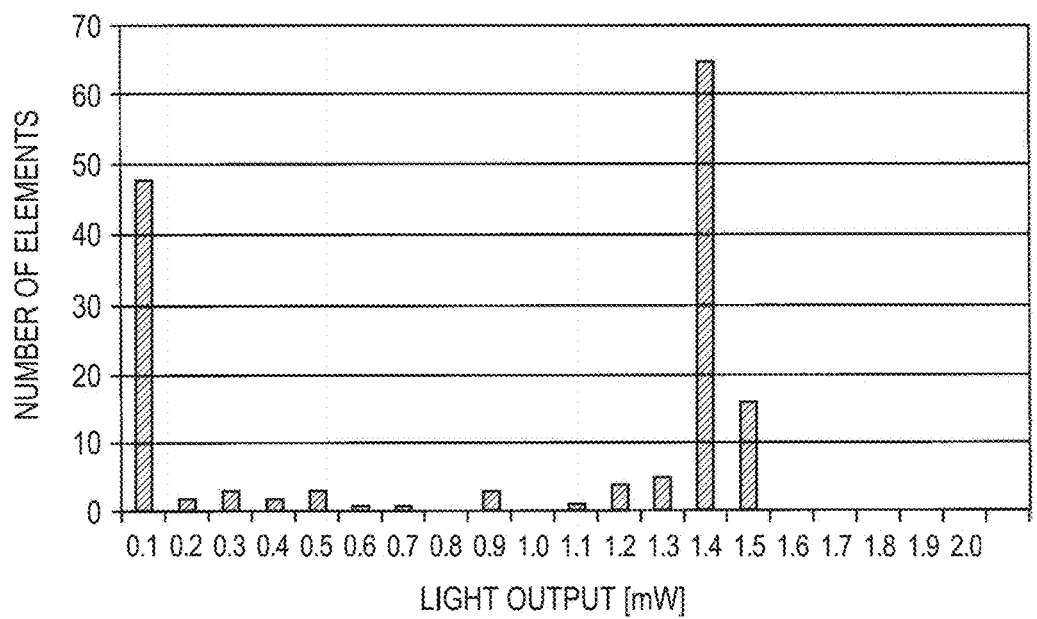
FIG. 17 is a histogram showing an experimental result of a vertical cavity surface emitting laser according to a reference example.

FIG. 14 is a histogram showing an experimental result of the vertical cavity surface emitting laser M1. FIG. 15 is a histogram showing an experimental result of the vertical cavity surface emitting laser M2. FIG. 16 is a histogram showing an experimental result of the vertical cavity surface emitting laser M3. FIG. 17 is a histogram showing an experimental result of the vertical cavity surface emitting laser M4. In the histograms shown in FIGS. 14 to 17, a horizontal axis indicates light output (mW) and a vertical axis indicates the number of elements (number).

As shown in FIG. 14, in the vertical cavity surface emitting laser M1, the largest number of elements having the light output of 1.3 mW to 1.4 mW is present, and variation in light output is slight, compared to the other vertical cavity surface emitting lasers M2, M3, and M4.

Herein, in the vertical cavity surface emitting lasers M1 to M4, when the current of 2 mA is supplied, the light output is approximately at 1.4 mW. Accordingly, in this experimental example, most of the emitted laser light of the elements having the light output of approximately 1.4 mW is not absorbed by the polarization filter and penetrate therethrough. That is, it can be said that the laser light of the elements having the light output of approximately 1.4 mW is polarized only in the X axis direction. In addition, it can be said that the laser light of the elements having the light output of 0 mW is polarized only in the Y axis direction.

Accordingly, from the experimental result shown in FIG. 14, it is found that the vertical cavity surface emitting laser M1 can stably emit the laser light polarized in the X axis direction.

As shown in FIG. 15, in the vertical cavity surface emitting laser M2 according to the reference example, the largest number of elements having the light output of 0 mW to 0.1 mW is present, but the peak is also at the light output of 1.3 mW to 1.4 mW, and the variation in light output is great, compared to the vertical cavity surface emitting laser M1. Accordingly, it is found that the polarization direction of the laser light of the vertical cavity surface emitting laser M2 is not stabilized.

As shown in FIG. 16, in the vertical cavity surface emitting laser M3 according to the reference example, the variation in light output is found. Accordingly, it is found that the polarization direction of the laser light of the vertical cavity surface emitting laser M3 is not stabilized.

As shown in FIG. 17, in the vertical cavity surface emitting laser M4 according to the reference example, the peaks are at the light output of 0 mW to 0.1 mW and 1.3 mW to 1.4 mW. Accordingly, it is found that the polarization direction of the laser light of the vertical cavity surface emitting laser M4 is stabilized in two directions of the X axis direction and the Y axis direction. That is, it can be said that the laser light of the vertical cavity surface emitting laser M4 is stabilized in both directions.

As described above, from this experimental example, it is found that the polarization direction is stabilized in one direction when the longitudinal direction of the laminated body 2 and the longitudinal direction of the resin layer 70 are the same direction.

2. Second Experimental Example

Figure 18A:
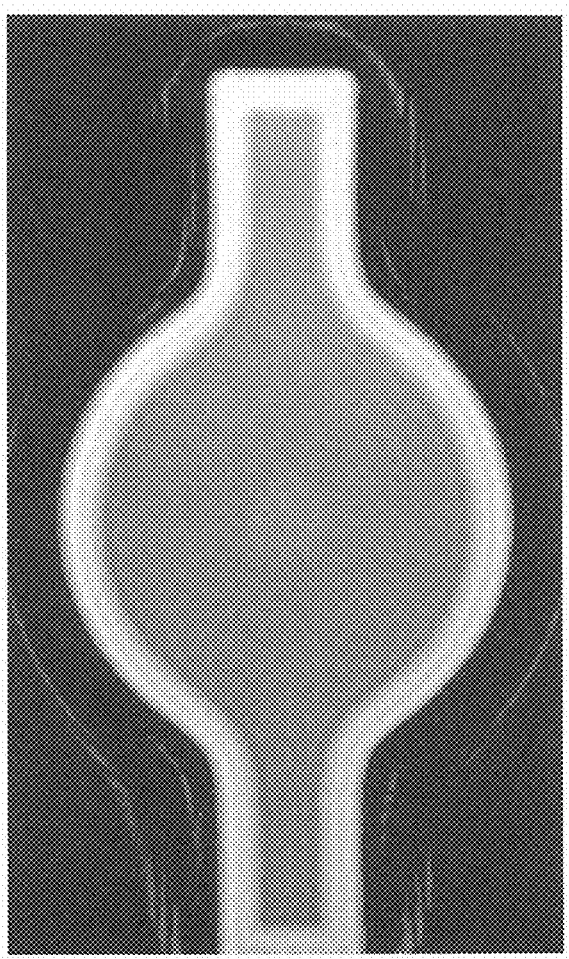
FIGS. 18A and 18B are photographs of a vertical cavity surface emitting laser used in a second experimental example.
Figure 19A:
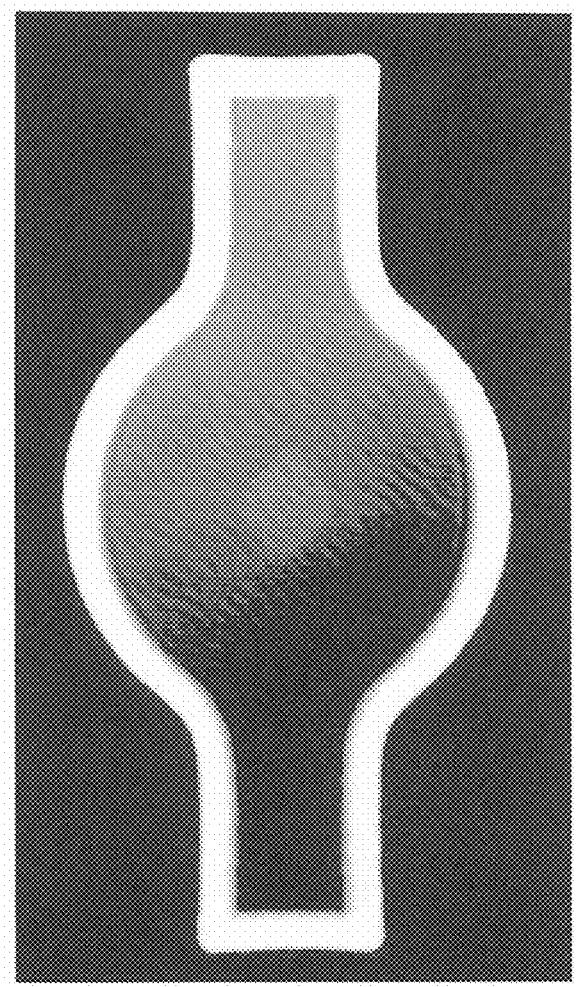
FIGS. 19A and 19B are photographs of a vertical cavity surface emitting laser used in a second experimental example.
Figure 19B:
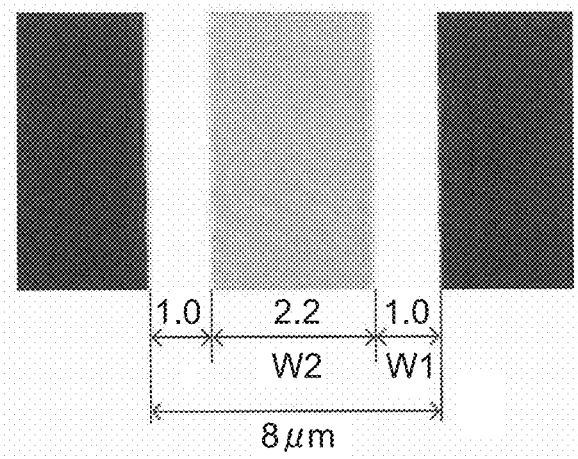
Figure 20A:
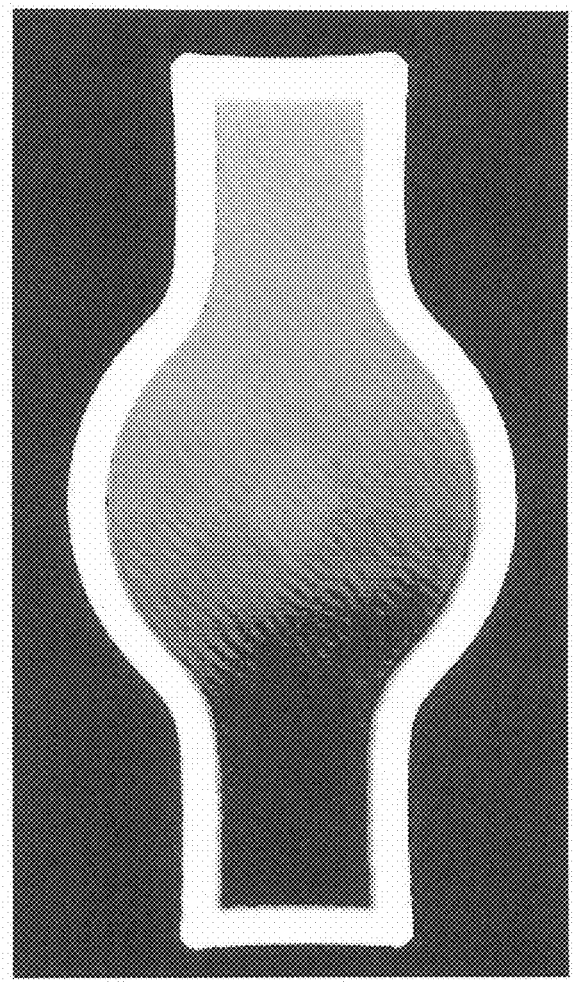
FIGS. 20A and 20B are photographs of a vertical cavity surface emitting laser used in a second experimental example.
Figure 20B:
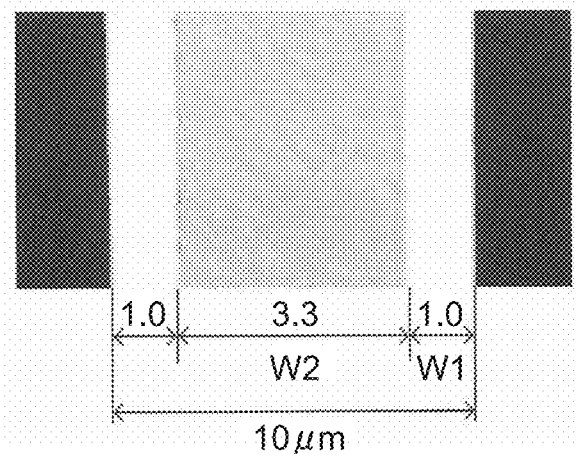

In a second experimental example, vertical cavity surface emitting lasers (types A to D) having different ratios W2/W1 of the W1 and the W2 shown in FIG. 3 are used. FIGS. 18A to 21 are photographs showing laminated bodies of the types A to D and are imaged using a confocal laser microscope. FIGS. 18A, 19A, and 20A show overall views of the laminated body and FIGS. 18B, 19B, and 20B show enlarged views of the distortion imparting portion of the laminated body.

Figure 18B:
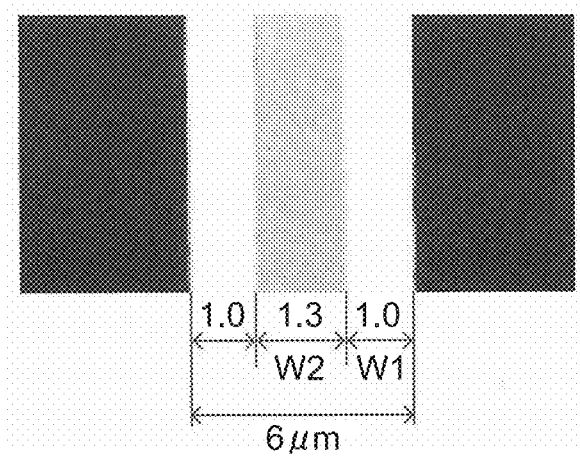
Figure 21:
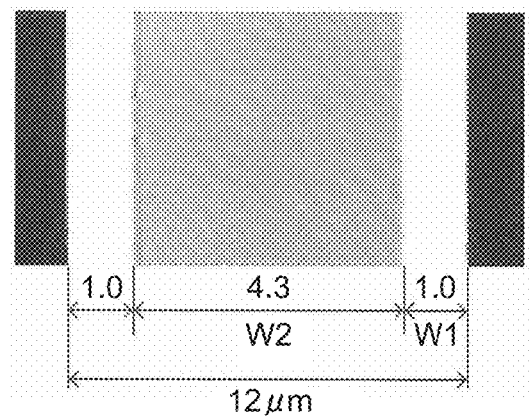
FIG. 21 is a photograph of a vertical cavity surface emitting laser used in a second experimental example.

As shown in FIGS. 18A and 18B, regarding the type A, the width of the distortion imparting portion is 6 μm and the ratio W2/W1 is 1.3. As shown in FIGS. 19A and 19B, regarding the type B, the width of the distortion imparting portion is 8 μm and the ratio W2/W1 is 2.2. As shown in FIGS. 20A and 20B, regarding the type C, the width of the distortion imparting portion is 10 μm and the ratio W2/W1 is 3.3. As shown in FIG. 21, regarding the type D, the width of the distortion imparting portion is 12 μm and the ratio W2/W1 is 4.3. The configuration of the vertical cavity surface emitting lasers used in this experimental example is the same as the configuration of the vertical cavity surface emitting laser 100 described above.

In this experimental example, the light output of the types A to D is measured with the polarization filter. Specifically, the current of approximately 0 mA to 2.5 mA is supplied to the vertical cavity surface emitting laser types A to D and the light emitted from the types A to D is caused to pass through the polarization filter having a polarization transmission axis in the X axis direction, to measure the light output. The plurality of each of the types A to D are prepared and the above measurement is performed.

Figure 22:
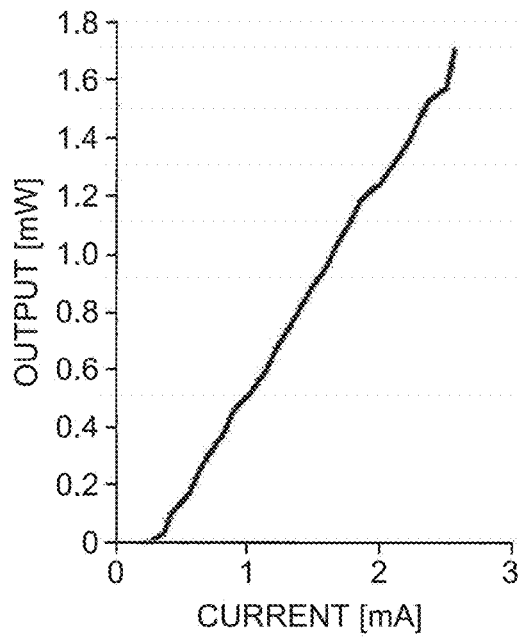
FIG. 22 is a graph showing a relationship between current and output of a functional vertical cavity surface emitting laser.
Figure 23:
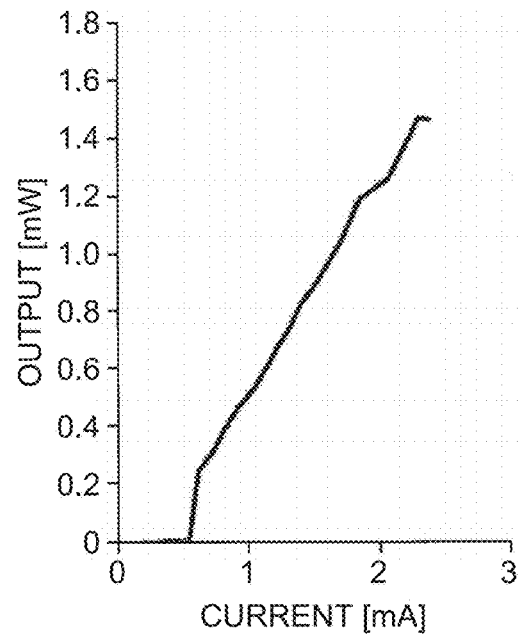
FIG. 23 is a graph showing a relationship between current and output of a defective vertical cavity surface emitting laser.

As shown in FIG. 22, in this measurement, the vertical cavity surface emitting laser of which the output becomes great as the current value becomes great, is determined as a functional product. Meanwhile, as shown in FIG. 23, the vertical cavity surface emitting laser having a portion where the output does not become great (in the example shown in FIG. 23, an area with the current value of 0 mA to 0.6 mA) even when the current value becomes great, is determined as a defective product. In the example shown in FIG. 23, the emitted light is not polarized in the X axis direction in the area with the current value of 0 mA to 0.6 mA, and the emitted light is polarized in the X axis direction in an area with the current value equal to or greater than 0.6 mA. That is, in the example as shown in FIG. 23, it can be said that the polarization direction is not stable.

Table 1 shows the number of defective products of the types A to D.

TABLE 1

| Type | Width of distortion imparting portion [μm] | W2/W1 | Measurement number | Number of defective products |
|---|---|---|---|---|
| A | 6 | 1.3 | 60 | 0 |
| B | 8 | 2.2 | 56 | 0 |
| C | 10 | 3.3 | 78 | 11 |
| D | 12 | 4.3 | 78 | 53 |

In Table 1, it is found that, when W2/W1≤3.3, the number of the defective products is equal to or less than half of the total number (measurement number) and the polarization direction of the vertical cavity surface emitting laser is stabilized. In addition, it is found that, when 1.3≤W2/W1≤2.2, the number of the defective products is zero, and the polarization direction of the vertical cavity surface emitting laser is further stabilized.

1.4. Modification Examples

Next, modification examples of the vertical cavity surface emitting laser according to the first embodiment will be described.

1. First Modification Example

Figure 24:
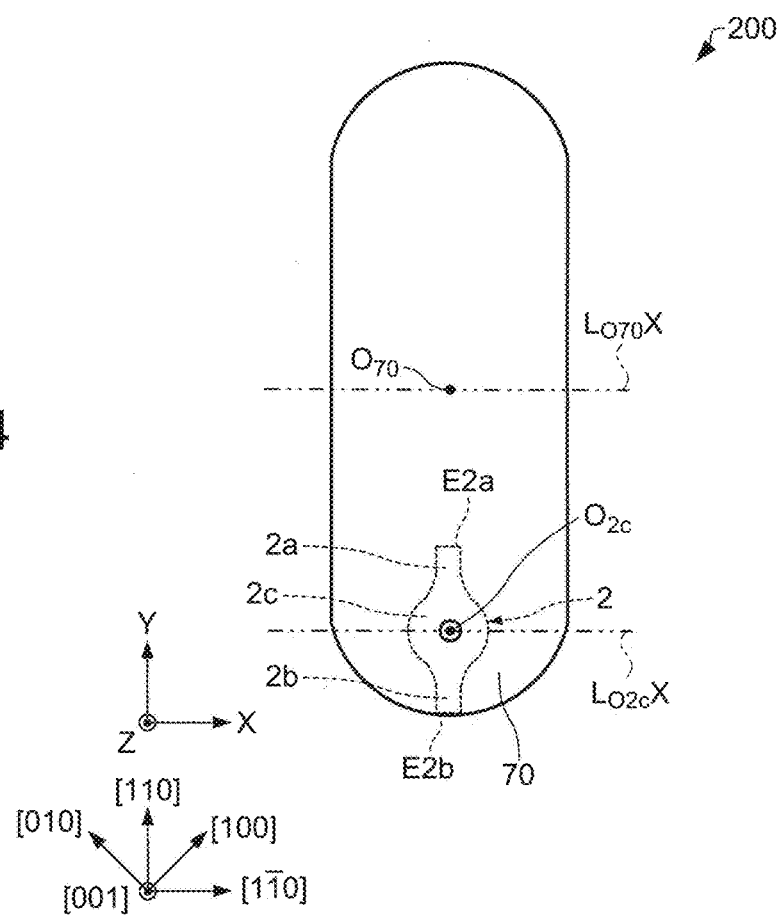
FIG. 24 is a plan view schematically showing a vertical cavity surface emitting laser according to a first modification example of a first embodiment.

First, a first modification example will be described with reference to the drawings. FIG. 24 is a plan view schematically showing a vertical cavity surface emitting laser 200 according to the first modification example. In FIG. 24, members other than the laminated body 2 and the resin layer 70 are omitted, for the sake of convenience. Hereinafter, in the vertical cavity surface emitting laser 200 according to the first modification example, the members having the same functions as the constituent members of the vertical cavity surface emitting laser 100 described above use the same reference numerals, and the specific description thereof will be omitted.

As shown in FIG. 24, the vertical cavity surface emitting laser 200 is different from the vertical cavity surface emitting laser 100 in a point where the resin layer 70 does not have a shape line-symmetrical with respect to the virtual straight line $L_{O2c}X$ in the X axis direction passing through the center $O_{2c}$ of the resonance portion 2c, in a plan view.

In the example shown in FIG. 24, in a plan view, the resin layer 70 has a shape line-symmetrical with respect to a virtual straight line $L_{O70}X$, and the virtual straight line $L_{O70}X$ is positioned on the positive Y axis direction side of the virtual straight line $L_{O2c}X$. In the vertical cavity surface emitting laser 200, in a plan view, the center $O_{70}$ of the resin layer 70 and the center $O_{2c}$ of the resonance portion 2c do not coincide with each other.

In the vertical cavity surface emitting laser 200, it is possible to stabilize the polarization direction of the laser light, in the same manner as in the vertical cavity surface emitting laser 100. (Refer to the following experimental examples.)

Hereinafter, experimental examples will be described in detail. The invention is not limited by the following experimental examples.

Figure 25:
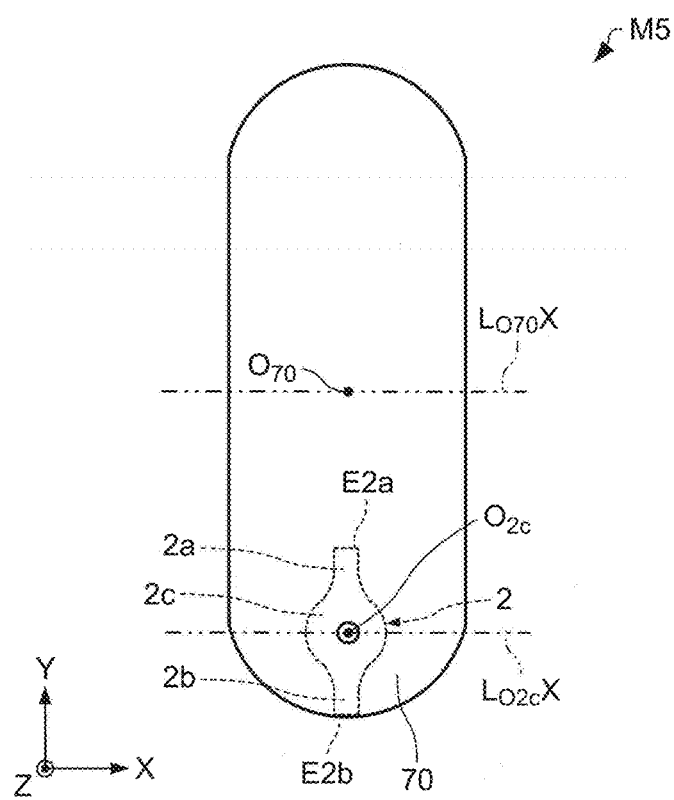
FIG. 25 is a plan view schematically showing a vertical cavity surface emitting laser according to the experimental example.

FIG. 25 is a plan view schematically showing a vertical cavity surface emitting laser M5 according to the experimental example. In FIG. 25, members other than the laminated body 2 and the resin layer 70 are omitted, for the sake of convenience. As shown in FIG. 25, the vertical cavity surface emitting laser M5 is different from the vertical cavity surface emitting laser M1 shown in FIG. 10 in a point where the resin layer 70 does not have a shape line-symmetrical with respect to the virtual straight line $L_{O2c}X$ in the X axis direction passing through the center $O_{2c}$ of the resonance portion 2c, in a plan view. The vertical cavity surface emitting laser M5 has the same configuration as the vertical cavity surface emitting laser M1, except for the above points.

In this experimental example, the light output of the vertical cavity surface emitting laser M5 is measured with the polarization filter, in the same manner as the first experimental example.

Figure 26:
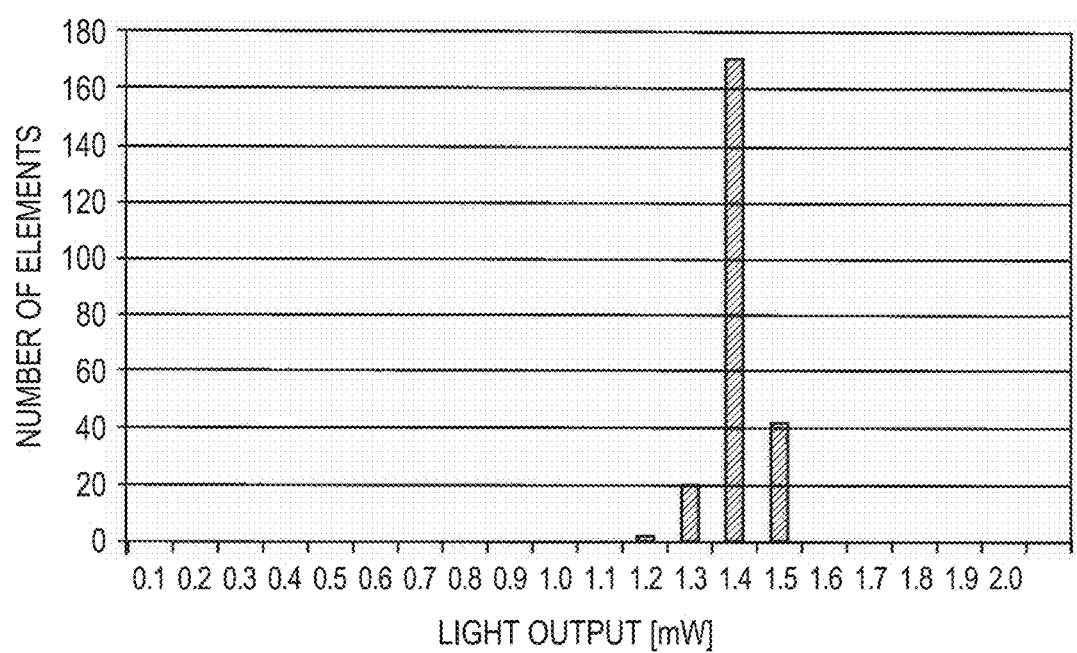
FIG. 26 is a histogram showing an experimental result of a vertical cavity surface emitting laser according to the experimental example.

FIG. 26 is a histogram showing an experimental result of the vertical cavity surface emitting laser M5. In the histogram shown in FIG. 26, a horizontal axis indicates light output (mW) and a vertical axis indicates the number of elements (number).

As shown in FIG. 26, in the vertical cavity surface emitting laser M5, the largest number of elements having the light output of 1.3 mW to 1.4 mW is present, and the variation in light output is slight, compared to the vertical cavity surface emitting lasers M2, M3, and M4 according to the reference examples. For example, the degree of the variation is the same as that of the vertical cavity surface emitting laser M1.

Accordingly, from the experimental result shown in FIG. 26, it is found that the vertical cavity surface emitting laser M5 can stably emit the laser light polarized in the X axis direction.

As described above, it is found that, even when the resin layer 70 in the vertical cavity surface emitting laser does not have a shape line-symmetrical with respect to the virtual straight line $L_{O2c}X$, the polarization direction is stabilized in one direction, as long as the longitudinal direction of the laminated body 2 and the longitudinal direction of the resin layer 70 are the same direction.

2. Second Modification Example

Figure 27:
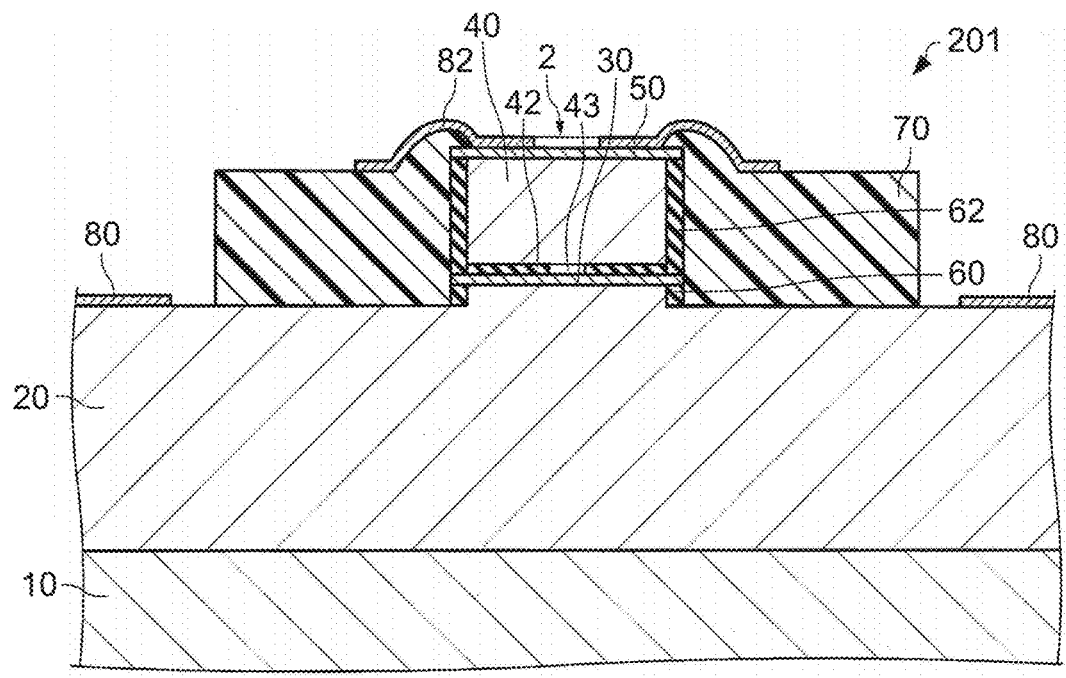
FIG. 27 is a cross-sectional view schematically showing a vertical cavity surface emitting laser according to a second modification example of a first embodiment.

Next, a second modification example will be described with reference to the drawings. FIG. 27 is a cross-sectional view schematically showing a vertical cavity surface emitting laser 201 according to the second modification example and corresponds to FIG. 2. Hereinafter, the points of the vertical cavity surface emitting laser 201 different from the example of the vertical cavity surface emitting laser 100 described above will be described, and the overlapped description will be omitted.

As shown in FIG. 2, in the vertical cavity surface emitting laser 100, the side surface of the laminated body 2 is inclined with respect to the upper surface of the substrate 10. Meanwhile, as shown in FIG. 27, in the vertical cavity surface emitting laser 201, the side surface of the laminated body 2 is vertical to the upper surface of the substrate 10.

In the vertical cavity surface emitting laser 201, it is possible to stabilize the polarization direction of the laser light, in the same manner as the vertical cavity surface emitting laser 100.

2. Second Embodiment

Figure 28:
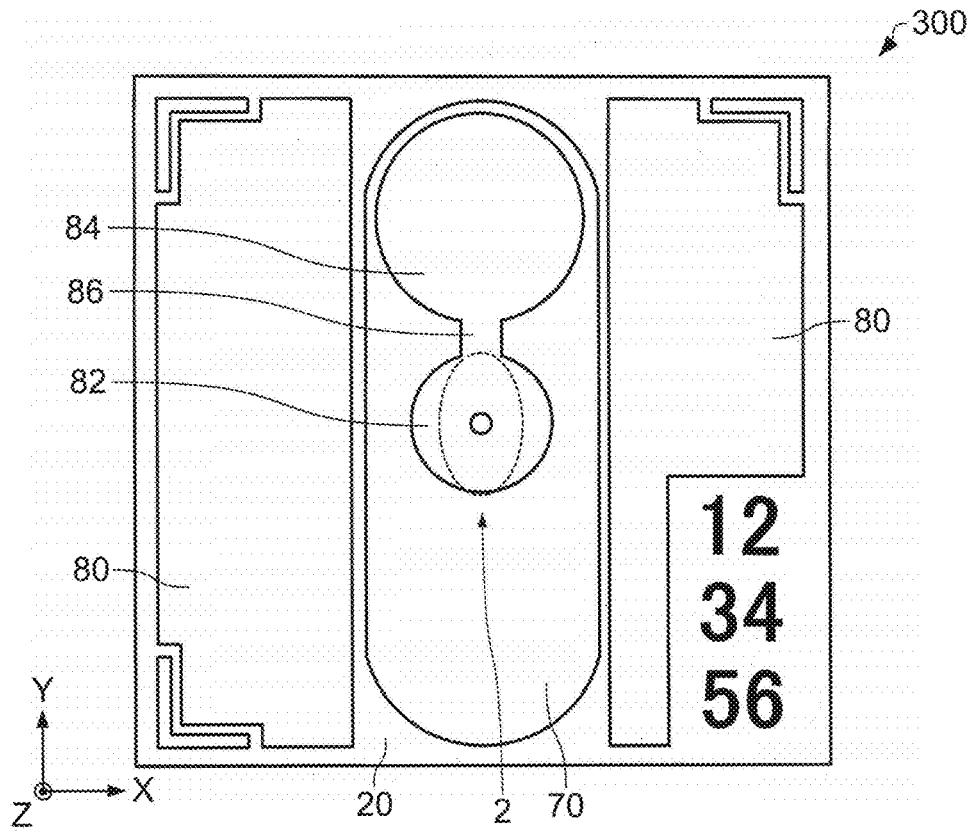
FIG. 28 is a plan view schematically showing a vertical cavity surface emitting laser according to a second embodiment.
Figure 29:
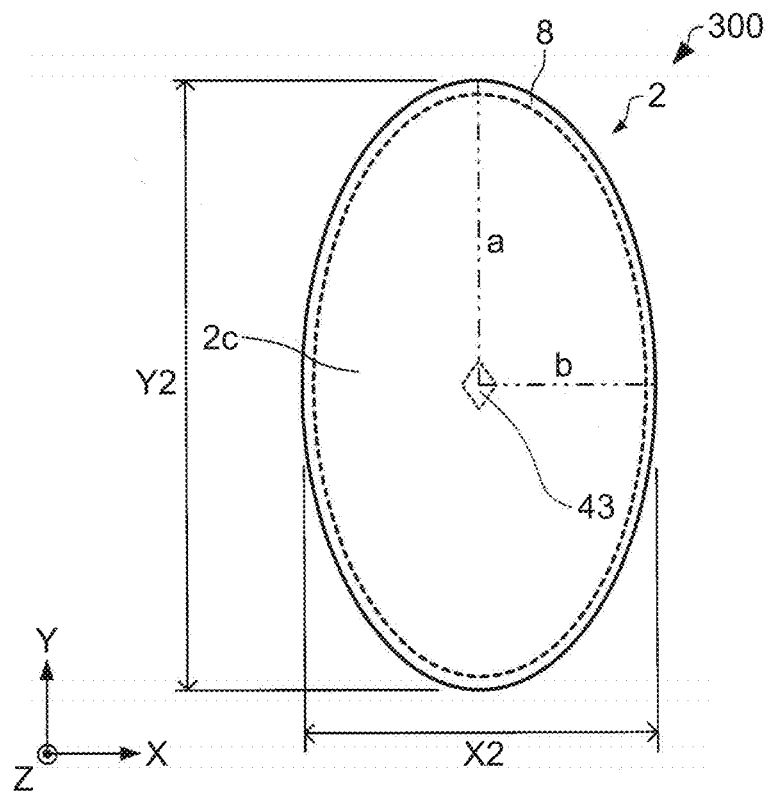
FIG. 29 is a plan view schematically showing a vertical cavity surface emitting laser according to a second embodiment.

Next, a vertical cavity surface emitting laser according to a second embodiment will be described with reference to the drawings. FIGS. 28 and 29 are plan views schematically showing a vertical cavity surface emitting laser 300 according to the second embodiment. In FIG. 29, members other than the laminated body 2 of the vertical cavity surface emitting laser 300 are omitted. Hereinafter, in the vertical cavity surface emitting laser 300 according to the second embodiment, the members having the same functions as the constituent members of the vertical cavity surface emitting laser 100 described above use the same reference numerals, and the specific description thereof will be omitted.

As shown in FIGS. 28 and 29, the vertical cavity surface emitting laser 300 is different from the vertical cavity surface emitting laser 100 described above, in a point where the planar shape of the laminated body 2 is an ellipse.

As shown in FIG. 29, in a plan view, the length Y2 of the laminated body 2 in the Y axis direction is greater than the length X2 thereof in the X axis direction. That is, in a plan view, the laminated body 2 has a shape having a longitudinal direction in the Y axis direction. In the example shown in FIG. 29, the planar shape of the laminated body 2 is an ellipse including a long axis a and a short axis b, the long axis a is in parallel with the Y axis direction, and the short axis b is in parallel with the X axis direction.

Figure 30:
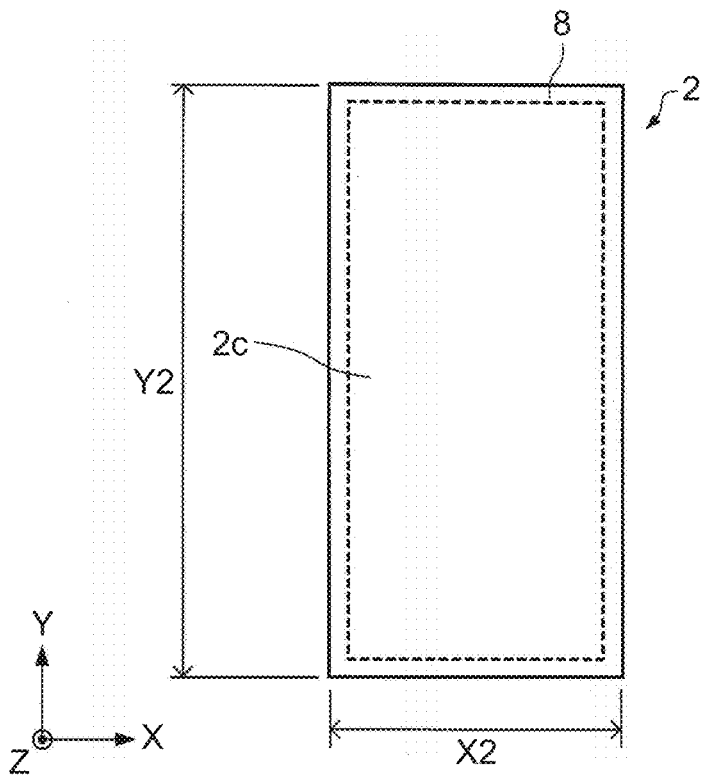
FIG. 30 is a plan view schematically showing a vertical cavity surface emitting laser according to a modification example of a second embodiment.

The planar shape of the laminated body 2 is not limited to an ellipse. FIG. 30 is a plan view schematically showing a modification example of the vertical cavity surface emitting laser 300. In FIG. 30, members other than the laminated body 2 are omitted.

As shown in FIG. 30, the planar shape of the laminated body 2 may be a rectangle (excluding a square). As shown in FIG. 30, in a plan view, the length Y2 of the laminated body 2 in the Y axis direction is greater than the length X2 thereof in the X axis direction. That is, in a plan view, the laminated body 2 has a shape having a longitudinal direction in the Y axis direction. In the example shown in FIG. 30, the planar shape of the laminated body 2 is a rectangle, a long side of the rectangle is in parallel with the Y axis direction, and a short side of the rectangle is in parallel with the X axis direction.

Since the laminated body 2 has a shape in which the resonance portion 2c has a longitudinal direction in the Y axis direction without providing the distortion imparting portions 2a and 2b (see FIG. 3), the anisotropic stress (distortion) is applied to the active layer 30.

In the vertical cavity surface emitting laser 300, in a plan view, the length Y2 of the laminated body 2 in the Y axis direction is greater than the length X2 of the laminated body 2 in the X axis direction, and in a plan view, the length Y70 of the resin layer 70 in the Y axis direction is greater than the length X70 of the resin layer 70 in the X axis direction. In a plan view, since the length Y2 of the laminated body 2 in the Y axis direction is greater than the length X2 of the laminated body 2 in the X axis direction, it is possible to apply the anisotropic stress to the active layer 30. Accordingly, the stress generated by the shape of the laminated body 2 and the stress generated by the resin layer 70 can be applied to the active layer 30, and it is possible to stabilize the polarization direction of the laser light. Therefore, it is possible to further stabilize the polarization direction of the laser light, compared to a case where the stress is applied to the active layer 30 only by the resin layer 70.

The manufacturing method of the vertical cavity surface emitting laser 300 is the same as the manufacturing method of the vertical cavity surface emitting laser 100 described above, and therefore the description thereof will be omitted.

3. Third Embodiment

Figure 31:
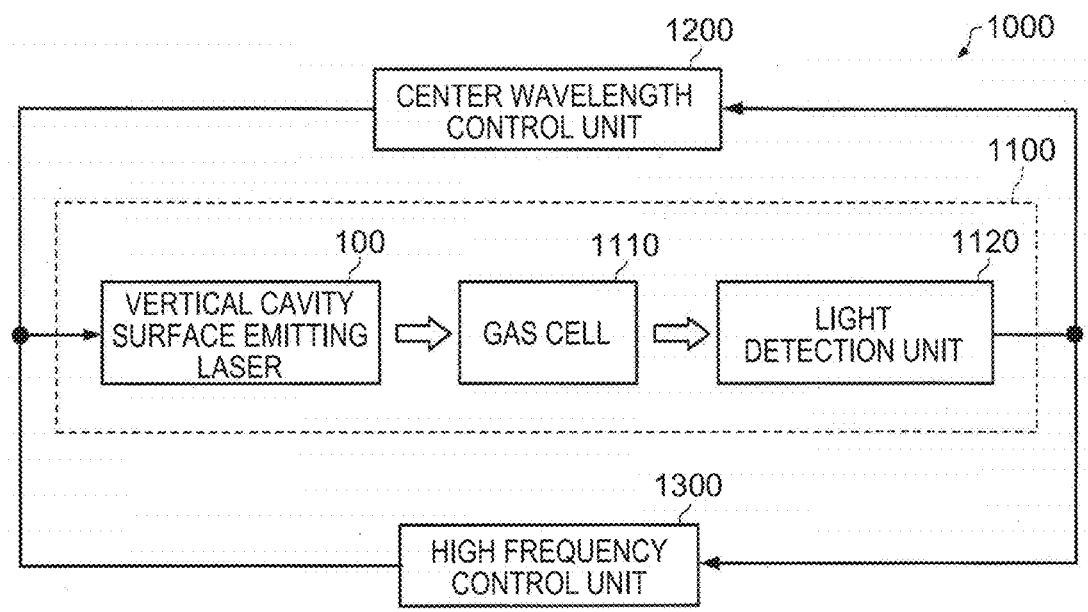
FIG. 31 is a functional block diagram of an atomic oscillator according to a third embodiment.

Next, an atomic oscillator according to a third embodiment will be described with reference to the drawings. FIG. 31 is a functional block diagram of an atomic oscillator 1000 according to the third embodiment.

As shown in FIG. 31, the atomic oscillator 1000 is configured to include an optical module 1100, a center wavelength control unit 1200, and a high frequency control unit 1300.

The optical module 1100 includes the vertical cavity surface emitting laser according to the invention (in the example shown in the drawing, the vertical cavity surface emitting laser 100), a gas cell 1110, and a light detection unit 1120.

Figure 32:
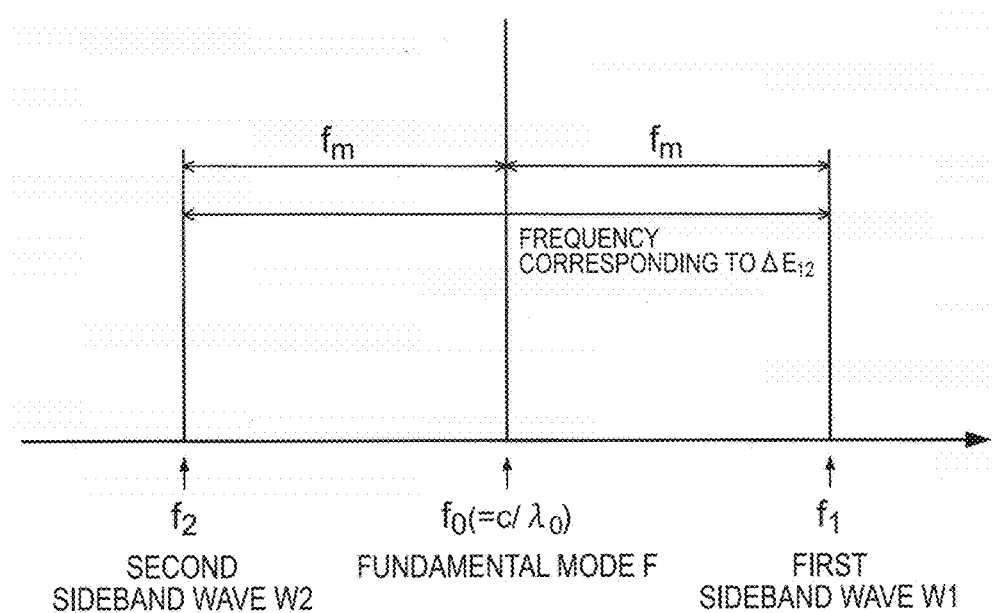
FIG. 32 is a view showing frequency spectra of resonant light.
Figure 33:
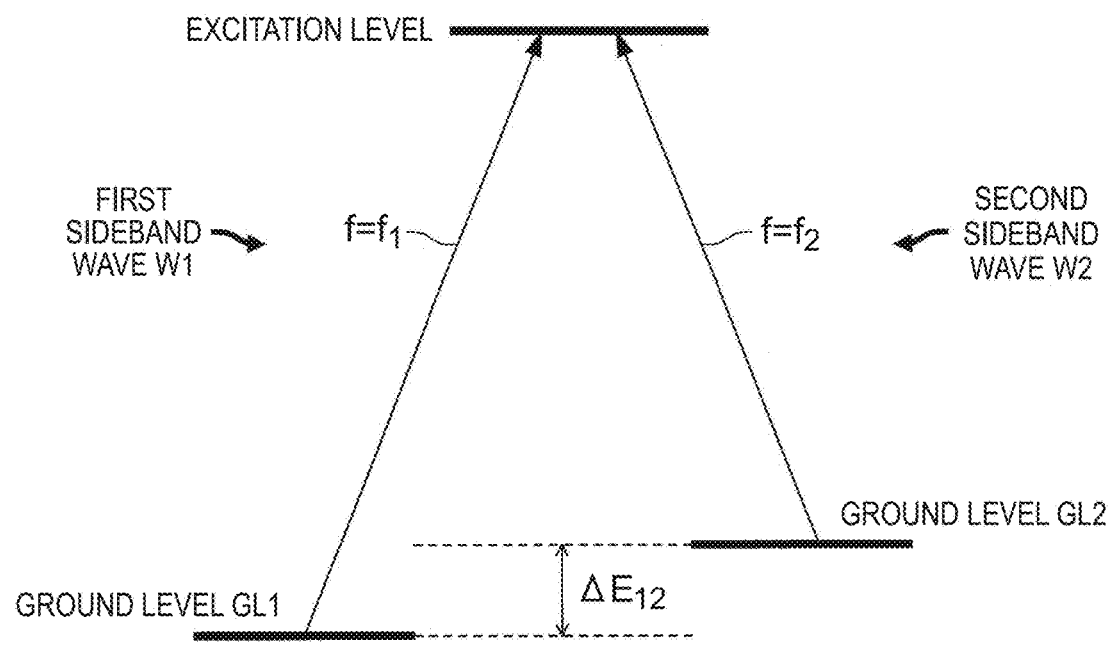
FIG. 33 is a view showing a relationship between Λ-shaped three level models of an alkaline metal atom, a first sideband wave, and a second sideband wave.

FIG. 32 is a view showing frequency spectra of light emitted by the vertical cavity surface emitting laser 100. FIG. 33 is a view showing a relationship between Λ-shaped three level models of an alkaline metal atom, a first sideband wave W1, and a second sideband wave W2. The light emitted from the vertical cavity surface emitting laser 100 includes a fundamental mode F including a center frequency $f_0$ (=$c/\lambda_0$: c represents velocity of light and $\lambda_0$ represents a center wavelength of laser light), the first sideband wave W1 including a frequency $f_1$ in an upstream sideband with respect to the center frequency $f_0$, and the second sideband wave W2 including a frequency $f_2$ in an downstream sideband with respect to the center frequency $f_0$, shown in FIG. 32. The frequency $f_1$ of the first sideband wave W1 satisfies $f_1=f_0+f_m$, and the frequency $f_2$ of the second sideband wave W2 satisfies $f_2=f_0-f_m$.

As shown in FIG. 33, a difference in frequencies between the frequency $f_1$ of the first sideband wave W1 and the frequency $f_2$ of the second sideband wave W2 coincides with a frequency corresponding to a difference in energy $\Delta E_{12}$ between a ground level GL1 and a ground level GL2 of the alkaline metal atom. Accordingly, the alkaline metal atom causes an EIT phenomenon to occur due to the first sideband wave W1 including the frequency $f_1$ and the second sideband wave W2 including the frequency $f_2$.

In the gas cell 1110, a gaseous alkaline metal atom (sodium atom, rubidium atom, cesium atom, and the like) is sealed in a container. When two light waves including the frequency (wavelength) corresponding to the difference in energy between two ground levels of the alkaline metal atom are emitted to the gas cell 1110, the alkaline metal atom causes the EIT phenomenon to occur. For example, if the alkaline metal atom is a sodium atom, the frequency corresponding to the difference in energy between the ground level GL1 and the ground level GL2 in a D1 line is 9.19263 ... GHz. Accordingly, when two light waves including the difference in frequency of 9.19263 ... GHz are emitted, the EIT phenomenon occurs.

The light detection unit 1120 detects the intensity of the light penetrating the alkaline metal atom sealed in the gas cell 1110. The light detection unit 1120 outputs a detection signal according to the amount of the light penetrating the alkaline metal atom. As the light detection unit 1120, a photodiode is used, for example.

The center wavelength control unit 1200 generates driving current having a magnitude corresponding to the detection signal output by the light detection unit 1120, supplies the driving current to the vertical cavity surface emitting laser 100, and controls the center wavelength $\lambda_0$ of the light emitted by the vertical cavity surface emitting laser 100. The center wavelength $\lambda_0$ of the laser light emitted by the vertical cavity surface emitting laser 100 is minutely adjusted and stabilized, by a feedback loop passing through the vertical cavity surface emitting laser 100, the gas cell 1110, the light detection unit 1120, and the center wavelength control unit 1200.

The high frequency control unit 1300 controls so that the difference in wavelengths (frequencies) between the first sideband wave W1 and the second sideband wave W2 is equivalent to the frequency corresponding to the difference in energy between two ground levels of the alkaline metal atom sealed in the gas cell 1110, based on the detection result output by the light detection unit 1120. The high frequency control unit 1300 generates a modulation signal including a modulation frequency $f_m$ (see FIG. 32) according to the detection result output by the light detection unit 1120.

Feedback control is performed so that the difference in frequencies between the first sideband wave W1 and the second sideband wave W2 is extremely accurately equivalent to the frequency corresponding to the difference in energy between two ground levels of the alkaline metal atom, by a feedback loop passing through the vertical cavity surface emitting laser 100, the gas cell 1110, the light detection unit 1120, and the high frequency control unit 1300. As a result, the modulation frequency $f_m$ becomes an extremely stabilized frequency, and therefore, the modulation signal can be set as an output signal (clock output) of the atomic oscillator 1000.

Next, the operations of the atomic oscillator 1000 will be described with reference to FIGS. 31 to 33.

The laser light emitted from the vertical cavity surface emitting laser 100 is incident to the gas cell 1110. The light emitted from the vertical cavity surface emitting laser 100 includes two light waves (the first sideband wave W1 and the second sideband wave W2) including the frequency (wavelength) corresponding to the difference in energy between two ground levels of the alkaline metal atom, and the alkaline metal atom causes the EIT phenomenon to occur. The intensity of the light penetrating the gas cell 1110 is detected by the light detection unit 1120.

The center wavelength control unit 1200 and the high frequency control unit 1300 perform the feedback control so that the difference in frequencies between the first sideband wave W1 and the second sideband wave W2 extremely accurately coincides with the frequency corresponding to the difference in energy between two ground levels of the alkaline metal atom. In the atomic oscillator 1000, a rapid change in a light absorbing behavior when the difference in frequencies $f_1$-$f_2$ between the first sideband wave W1 and the second sideband wave W2 is deviated from the frequency corresponding to the difference in energy $\Delta E_{12}$ between the ground level GL1 and the ground level GL2, is detected and controlled using the EIT phenomenon, and therefore it is possible to obtain an oscillator with high accuracy.

The embodiments and the modification examples are merely examples, and there is no limitation. For example, embodiments and the modification examples can also be suitably combined to each other.

The invention has configurations substantially the same as the configurations described in the embodiments (for example, configurations with the same function, method, and effects, or configurations with the same object and effect). The invention includes a configuration in which non-essential parts of the configurations described in the embodiments are replaced. The invention includes a configuration having the same operation effect as the configurations described in the embodiments or a configuration which can achieve the same object. The invention includes a configuration obtained by adding a well-known technology to the configurations described in the embodiments.

The entire disclosure of Japanese Patent Application No. 2013-263459 filed Dec. 20, 2013 is expressly incorporated by reference herein.

What is claimed is:

1. A vertical cavity surface emitting laser comprising:
   a substrate;
   a laminated body which is provided over the substrate; and
   a resin layer which is provided on at least an entire outer wall of the laminated body and a portion of the top of the laminated body; and
   an electrode provided over a portion of the top of the resin layer and over a portion of the top of the laminated body,
   wherein the laminated body at least includes a first mirror layer provided over the substrate, an active layer provided over the first mirror layer, and a second mirror layer provided over the active layer,
   in a plan view, a first maximum length of the laminated body in a first direction is greater than a second maximum length of the laminated body in a second direction orthogonal to the first direction, in the plan view, a first maximum length of the resin layer in the first direction is greater than a second maximum length of the resin layer in the second direction, in the plan view, the laminated body includes a first portion, a second portion, and a third portion provided between the first portion and the second portion, the first portion and the second portion face each other in the first direction, in the plan view, a length of the third portion in the second direction is greater than a length of the first portion in the second direction or a length of the second portion in the second direction, in the plan view, an outer rim of the resin layer includes a first straight edge, a second straight edge facing the first straight edge, a first curved edge which connects the first straight edge and the second straight edge to each other, and a second curved edge which faces the first curved edge and connects the first straight edge and the second straight edge to each other, in the plan view, the first portion and the first curved edge are positioned on the same side of the third portion, and in the plan view, when an end of the first straight edge coming in contact with the first curved edge is set as a first end, an end of the second straight edge coming in contact with the first curved edge is set as a second end, and a first virtual straight line passing through the first end and the second end is drawn, an end portion of the first portion is positioned on the third portion side of the first virtual straight line.

2. The vertical cavity surface emitting laser according to claim 1, wherein the laminated body further includes a current constriction layer provided between the first mirror layer and the second mirror layer, a first area including a plurality of oxide layers connected to the first mirror layer, and a second area including a plurality of oxide layers connected to the second mirror layer, in the plan view, an oxide area is configured with the first area and the second area of the first portion of the laminated body, and in the plan view, when a width of the oxide area is W1 and a width of an upper surface of the second mirror layer of the first portion is W2, $W2/W1 \leq 3.3$.

3. The vertical cavity surface emitting laser according to claim 2, wherein $W2/W1 \leq 2.2$.

4. The vertical cavity surface emitting laser according to claim 2, wherein $1.3 \leq W2/W1$.

5. The vertical cavity surface emitting laser according to claim 2, wherein, in the plan view, when a second virtual straight line orthogonal to the first direction is drawn on the first portion, the W2 is measured on the second virtual straight line.

6. The vertical cavity surface emitting laser according to claim 5, wherein, in the plan view, a first portion and a second portion of the oxide area overlap the second virtual straight line and interpose the upper surface of the second mirror layer therebetween, the first portion of the oxide area has the width W1, and W1 is measured on the second virtual straight line.

7. The vertical cavity surface emitting laser according to claim 1, wherein the laminated body further includes a current constriction layer provided between the first mirror layer and the second mirror layer, a first area including a plurality of oxide layers connected to the first mirror layer, and a second area including a plurality of oxide layers connected to the second mirror layer, in a cross-sectional view, the lowermost oxide layer among the plurality of oxide layers in the first area includes a first end facing an end in contact with the first mirror layer of the first portion, in the cross-sectional view, the topmost oxide layer among the plurality of oxide layers in the second area includes a second end in contact with the second mirror layer of the first portion, and in the plan view, when a width from the first end to the second end is W1 and a width of an upper surface of the second mirror layer of the first portion is W2, $W2/W1 \leq 3.3$.

8. The vertical cavity surface emitting laser according to claim 7, wherein $W2/W1 \leq 2.2$.

9. The vertical cavity surface emitting laser according to claim 7, wherein $1.3 \leq W2/W1$.

10. The vertical cavity surface emitting laser according to claim 7, wherein, in the plan view, when a second virtual straight line orthogonal to the first direction is drawn on the first portion, the W2 is measured on the second virtual straight line.

11. The vertical cavity surface emitting laser according to claim 10, wherein, in the cross-sectional view, a first portion and a second portion of the first area are provided so as to interpose the first mirror layer of the first portion of the laminated body, in the cross-sectional view, a first portion of the second area is provided over the first portion of the first area and a second portion of the second area is provided over the second portion of the first area, so as to interpose the second mirror layer of the first portion of the laminated body, the first portion of the first area includes the lowermost oxide layer, the first portion of the second area includes the topmost oxide layer, and the W1 is measured on the second virtual straight line.

12. The vertical cavity surface emitting laser according to claim 1, wherein, in the plan view, the resin layer has a line-symmetrical shape with respect to a third virtual straight line in the second direction passing through a center of the third portion.

13. The vertical cavity surface emitting laser according to claim 1, wherein, in the plan view, the laminated body further includes a first distortion imparting portion, a second distortion imparting portion, and a resonance portion which is provided between the first distortion imparting portion and the second distortion imparting portion and resonates light generated by the active layer, the first distortion imparting portion and the second distortion imparting portion face each other in the first direction, and in the plan view, a length of the resonance portion in the second direction is greater than a length of the first distortion imparting portion in the second direction or a length of the second distortion imparting portion in the second direction.

14. The vertical cavity surface emitting laser according to claim 13,
wherein, in the plan view, an outer rim of the resin layer includes a first straight edge, a second straight edge facing the first straight edge, a first curved edge which connects the first straight edge and the second straight edge to each other, and a second curved edge which faces the first curved edge and connects the first straight edge and the second straight edge to each other.

15. The vertical cavity surface emitting laser according to claim 14,
wherein, in the plan view, the first distortion imparting portion and the first curved edge are positioned on the same side of the resonance portion, and
in the plan view, when an end of the first straight edge coming in contact with the first curved edge is set as a first end, an end of the second straight edge coming in contact with the first curved edge is set as a second end, and a first virtual straight line passing through the first end and the second end is drawn, an end portion of the first distortion imparting portion is positioned on the resonance portion side of the first virtual straight line.

16. The vertical cavity surface emitting laser according to claim 13,
wherein the laminated body further includes a current constriction layer provided between the first mirror layer and the second mirror layer, a first area including a plurality of oxide layers connected to the first mirror layer, and a second area including a plurality of oxide layers connected to the second mirror layer,
in the plan view, an oxide area is configured with the first area and the second area of the first distortion imparting portion of the laminated body, and
in the plan view, when a width of the oxide area is W1 and a width of an upper surface of the second mirror layer of the first distortion imparting portion is W2, W2/W1≤3.3.

17. The vertical cavity surface emitting laser according to claim 16,
wherein W2/W1≤2.2.

18. The vertical cavity surface emitting laser according to claim 16,
wherein 1.3≤W2/W1.

19. The vertical cavity surface emitting laser according to claim 16,
wherein, in the plan view, when a second virtual straight line orthogonal to the first direction is drawn on the first distortion imparting portion, the W2 is measured on the second virtual straight line.

20. The vertical cavity surface emitting laser according to claim 19,
wherein, in the plan view, a first portion and a second portion of the oxide area overlap the second virtual straight line so as to interpose the upper surface of the second mirror layer therebetween,
the first portion of the oxide area has the width W1, and the W1 is measured on the second virtual straight line.

21. The vertical cavity surface emitting laser according to claim 13,
wherein the laminated body further includes a current constriction layer provided between the first mirror layer and the second mirror layer, a first area including a plurality of oxide layers connected to the first mirror layer, and a second area including a plurality of oxide layers connected to the second mirror layer,
in a cross-sectional view, the lowermost oxide layer among the plurality of oxide layers in the first area includes a first end facing an end in contact with the first mirror layer of the first distortion imparting portion,
in the cross-sectional view, the topmost oxide layer among the plurality of oxide layers in the second area includes a second end which comes in contact with the second mirror layer of the first distortion imparting portion, and
in the plan view, when a width from the first end to the second end is W1 and a width of an upper surface of the second mirror layer of the first distortion imparting portion is W2, W2/W1≤3.3.

22. The vertical cavity surface emitting laser according to claim 21,
wherein W2/W1≤2.2.

23. The vertical cavity surface emitting laser according to claim 21,
wherein 1.3≤W2/W1.

24. The vertical cavity surface emitting laser according to claim 21,
wherein, in the plan view, when a second virtual straight line orthogonal to the first direction is drawn on the first distortion imparting portion, the W2 is measured on the second virtual straight line.

25. The vertical cavity surface emitting laser according to claim 24,
wherein, in the cross-sectional view, a first portion and a second portion of the first area are provided so as to interpose the first mirror layer of the first distortion imparting portion of the laminated body,
in the cross-sectional view, a first portion of the second area is provided over the first portion of the first area and a second portion of the second area is provided over the second portion of the first area, so as to interpose the second mirror layer of the first distortion imparting portion of the laminated body,
the first portion of the first area includes the lowermost oxide layer,
the first portion of the second area includes the topmost oxide layer, and
the W1 is measured on the second virtual straight line.

26. The vertical cavity surface emitting laser according to claim 13,
wherein, in the plan view, the resin layer has a line-symmetrical shape with respect to a third virtual straight line in the second direction passing through a center of the resonance portion.

27. The vertical cavity surface emitting laser according to claim 13,
wherein, in the plan view, the resin layer has a line-asymmetrical shape with respect to a third virtual straight line in the second direction passing through a center of the resonance portion.

28. The vertical cavity surface emitting laser according to claim 1,
wherein a material of the resin layer is polyimide.

29. An atomic oscillator comprising:
the vertical cavity surface emitting laser according to claim 1.

30. A vertical cavity surface emitting laser comprising:
a substrate;
a laminated body which is provided over the substrate; and
a resin layer which is provided on at least an entire outer wall of the laminated body and a portion of the top of the laminated body; and an electrode provided over a portion of the top of the resin layer and over a portion of the top of the laminated body, wherein the laminated body at least includes a first mirror layer provided over the substrate, an active layer provided over the first mirror layer, and a second mirror layer provided over the active layer, in a plan view, a first maximum length of the laminated body in a first direction is greater than a second maximum length of the laminated body in a second direction orthogonal to the first direction, in the plan view, a first maximum length of the resin layer in the first direction is greater than a second maximum length of the resin layer in the second direction, in the plan view, the laminated body includes a first portion, a second portion, and a third portion provided between the first portion and the second portion, the first portion and the second portion face each other in the first direction, in the plan view, a length of the third portion in the second direction is greater than a length of the first portion in the second direction or a length of the second portion in the second direction, the laminated body further includes a current constriction layer provided between the first mirror layer and the second mirror layer, a first area including a plurality of oxide layers connected to the first mirror layer, and a second area including a plurality of oxide layers connected to the second mirror layer, in a cross-sectional view, the lowermost oxide layer among the plurality of oxide layers in the first area includes a first end facing an end in contact with the first mirror layer of the first portion, in the cross-sectional view, the topmost oxide layer among the plurality of oxide layers in the second area includes a second end in contact with the second mirror layer of the first portion, and in the plan view, when a width from the first end to the second end is W1 and a width of an upper surface of the second mirror layer of the first portion is W2, $W2/W1 \leq 3.3$.

31. A vertical cavity surface emitting laser comprising:

a substrate;

a laminated body which is provided over the substrate; and a resin layer which is provided on at least an entire outer wall of the laminated body and a portion of the top of the laminated body; and an electrode provided over a portion of the top of the resin layer and over a portion of the top of the laminated body, wherein the laminated body at least includes a first mirror layer provided over the substrate, an active layer provided over the first mirror layer, and a second mirror layer provided over the active layer, in a plan view, a first maximum length of the laminated body in a first direction is greater than a second maximum length of the laminated body in a second direction orthogonal to the first direction, in the plan view, a first maximum length of the resin layer in the first direction is greater than a second maximum length of the resin layer in the second direction, in the plan view, the laminated body further includes a first distortion imparting portion, a second distortion imparting portion, and a resonance portion which is provided between the first distortion imparting portion and the second distortion imparting portion and resonates light generated by the active layer, the first distortion imparting portion and the second distortion imparting portion face each other in the first direction, and in the plan view, a length of the resonance portion in the second direction is greater than a length of the first distortion imparting portion in the second direction or a length of the second distortion imparting portion in the second direction.

* * * * *